United States Patent
U'Ren

(10) Patent No.: US 7,545,552 B2
(45) Date of Patent: Jun. 9, 2009

(54) SACRIFICIAL SPACER PROCESS AND RESULTANT STRUCTURE FOR MEMS SUPPORT STRUCTURE

(75) Inventor: Gregory David U'Ren, Berkeley, CA (US)

(73) Assignee: Qualcomm Mems Technologies, Inc., San Diego, CA (US)

( * ) Notice: Subject to any disclaimer, the term of this patent is extended or adjusted under 35 U.S.C. 154(b) by 0 days.

(21) Appl. No.: 11/583,575

(22) Filed: Oct. 19, 2006

(65) Prior Publication Data

US 2008/0094686 A1 Apr. 24, 2008

(51) Int. Cl.
*G02B 26/00* (2006.01)
*G02B 26/08* (2006.01)

(52) U.S. Cl. ...................... 359/290; 359/224

(58) Field of Classification Search .............. 359/198, 359/223, 224, 247, 290, 302
See application file for complete search history.

(56) References Cited

U.S. PATENT DOCUMENTS

| | | |
|---|---|---|
| 3,728,030 A | 4/1973 | Hawes |
| 3,955,880 A | 5/1976 | Lierke |
| 4,377,324 A | 3/1983 | Durand et al. |
| 4,403,248 A | 9/1983 | te Velde |
| 4,482,213 A | 11/1984 | Piliavin et al. |
| 4,519,676 A | 5/1985 | te Velde |
| 4,566,935 A | 1/1986 | Hornbeck |
| 4,662,746 A | 5/1987 | Hornbeck |
| 4,710,732 A | 12/1987 | Hornbeck |
| 4,786,128 A | 11/1988 | Birnbach |
| 4,790,635 A | 12/1988 | Apsley |
| 4,859,060 A | 8/1989 | Katagiri et al. |
| 4,900,136 A | 2/1990 | Goldburt et al. |
| 4,954,789 A | 9/1990 | Sampsell |
| 4,956,619 A | 9/1990 | Hornbeck |
| 4,965,562 A | 10/1990 | Verhulst |

(Continued)

FOREIGN PATENT DOCUMENTS

CH 680534 9/1992

(Continued)

OTHER PUBLICATIONS

Aratani et al., "Process and Design Considerations for Surface Micromachined Beams for a Tuneable Interferometer Array in Silicon," Proc. IEEE Microelectromechanical Workshop, Fort Lauderdale, FL, pp. 230-235 (Feb. 1993).

(Continued)

*Primary Examiner*—William C Choi
(74) *Attorney, Agent, or Firm*—Knobbe, Martens, Olson & Bear, LLP

(57) ABSTRACT

Disclosed is a microelectromechanical systems (MEMS) device and method of manufacturing the same. MEMS such as an interferometric modulator include a sidewall spacer formed adjacent to a movable mirror. The sidewall spacer may be a sacrificial spacer that is removed during fabrication, or it may remain in the final product. Increased clearance is provided between the movable mirror and a support structure during actuation of the movable mirror, thereby avoiding contact during operation of the interferometric modulator. The deformable layer may be deposited in a more continuous fashion over the contour of a lower layer as determined by the contour of the sidewall spacer, resulting in a stronger and more resilient deformable layer.

31 Claims, 15 Drawing Sheets

U.S. PATENT DOCUMENTS

| | | |
|---|---|---|
| 5,022,745 A | 6/1991 | Zahowski et al. |
| 5,044,736 A | 9/1991 | Jaskie et al. |
| 5,075,796 A | 12/1991 | Schildkraut et al. |
| 5,083,857 A | 1/1992 | Hornbeck |
| 5,099,353 A | 3/1992 | Hornbeck |
| 5,124,834 A | 6/1992 | Cusano et al. |
| 5,142,414 A | 8/1992 | Koehler |
| 5,168,406 A | 12/1992 | Nelson |
| 5,172,262 A | 12/1992 | Hornbeck |
| 5,192,395 A | 3/1993 | Boysel et al. |
| 5,212,582 A | 5/1993 | Nelson |
| 5,226,099 A | 7/1993 | Mignardi et al. |
| 5,231,532 A | 7/1993 | Magel et al. |
| 5,233,456 A | 8/1993 | Nelson |
| 5,233,459 A | 8/1993 | Bozler et al. |
| 5,287,215 A | 2/1994 | Warde et al. |
| 5,293,272 A | 3/1994 | Jannson et al. |
| 5,311,360 A | 5/1994 | Bloom et al. |
| 5,312,512 A | 5/1994 | Allman et al. |
| 5,345,328 A | 9/1994 | Fritz et al. |
| 5,347,377 A | 9/1994 | Revelli, Jr. et al. |
| 5,381,232 A | 1/1995 | van Wijk |
| 5,454,906 A | 10/1995 | Baker et al. |
| 5,489,952 A | 2/1996 | Gove et al. |
| 5,497,262 A | 3/1996 | Kaeriyama |
| 5,500,761 A | 3/1996 | Goossen et al. |
| 5,517,347 A | 5/1996 | Sampsell |
| 5,526,172 A | 6/1996 | Kanack |
| 5,535,047 A | 7/1996 | Hornbeck |
| 5,551,293 A | 9/1996 | Boysel et al. |
| 5,552,924 A | 9/1996 | Tregilgas |
| 5,559,358 A | 9/1996 | Burns et al. |
| 5,578,976 A | 11/1996 | Yao |
| 5,583,688 A | 12/1996 | Hornbeck |
| 5,600,383 A | 2/1997 | Hornbeck |
| 5,606,441 A | 2/1997 | Florence et al. |
| 5,608,468 A | 3/1997 | Gove et al. |
| 5,619,059 A | 4/1997 | Li et al. |
| 5,619,365 A | 4/1997 | Rhoades et al. |
| 5,619,366 A | 4/1997 | Rhoads et al. |
| 5,629,790 A | 5/1997 | Neukermans et al. |
| 5,638,946 A | 6/1997 | Zavracky |
| 5,646,768 A | 7/1997 | Kaeiyama |
| 5,650,881 A | 7/1997 | Hornbeck |
| 5,661,591 A | 8/1997 | Lin et al. |
| 5,673,139 A | 9/1997 | Johnson |
| 5,673,785 A | 10/1997 | Schlaak et al. |
| 5,703,710 A | 12/1997 | Brinkman et al. |
| 5,710,656 A | 1/1998 | Goosen |
| 5,739,945 A | 4/1998 | Tayebati |
| 5,740,150 A | 4/1998 | Uchimaru et al. |
| 5,745,281 A | 4/1998 | Yi et al. |
| 5,751,469 A | 5/1998 | Arney et al. |
| 5,771,321 A | 6/1998 | Stern |
| 5,783,864 A | 7/1998 | Dawson et al. |
| 5,784,189 A | 7/1998 | Bozler et al. |
| 5,784,190 A | 7/1998 | Worley |
| 5,784,212 A | 7/1998 | Hornbeck |
| 5,786,927 A | 7/1998 | Greywall |
| 5,808,780 A | 9/1998 | McDonald |
| 5,808,781 A | 9/1998 | Arney et al. |
| 5,822,110 A | 10/1998 | Dabbaj |
| 5,825,528 A | 10/1998 | Goosen |
| 5,838,484 A | 11/1998 | Goossen et al. |
| 5,867,302 A | 2/1999 | Fleming et al. |
| 5,914,803 A | 6/1999 | Hwang et al. |
| 5,920,421 A | 7/1999 | Choi |
| 5,926,309 A | 7/1999 | Little |
| 5,943,155 A | 8/1999 | Goossen |
| 5,943,158 A | 8/1999 | Ford et al. |
| 5,959,763 A | 9/1999 | Bozler et al. |
| 5,972,193 A | 10/1999 | Chou et al. |
| 5,978,127 A | 11/1999 | Berg |
| 5,986,796 A | 11/1999 | Miles |
| 5,998,293 A | 12/1999 | Dawson et al. |
| 6,028,690 A | 2/2000 | Carter et al. |
| 6,031,653 A | 2/2000 | Wang |
| 6,038,056 A | 3/2000 | Florence et al. |
| 6,040,937 A | 3/2000 | Miles |
| 6,097,145 A | 8/2000 | Kastalsky et al. |
| 6,100,477 A | 8/2000 | Randall et al. |
| 6,104,525 A | 8/2000 | Min |
| 6,147,790 A | 11/2000 | Meier et al. |
| 6,149,190 A | 11/2000 | Galvin et al. |
| 6,170,332 B1 | 1/2001 | MacDonald et al. |
| 6,172,797 B1 | 1/2001 | Huibers |
| 6,195,196 B1 | 2/2001 | Kimura et al. |
| 6,201,633 B1 | 3/2001 | Peeters et al. |
| 6,215,221 B1 | 4/2001 | Cabuz et al. |
| 6,229,683 B1 | 5/2001 | Goodwin-Johansson |
| 6,249,039 B1 | 6/2001 | Harvey et al. |
| 6,282,010 B1 | 8/2001 | Sulzbach et al. |
| 6,284,560 B1 | 9/2001 | Jech et al. |
| 6,288,472 B1 | 9/2001 | Cabuz et al. |
| 6,288,824 B1 | 9/2001 | Kastalsky et al. |
| 6,295,154 B1 | 9/2001 | Laor et al. |
| 6,324,192 B1 | 11/2001 | Tayebati |
| 6,327,071 B1 | 12/2001 | Kimura et al. |
| 6,351,329 B1 | 2/2002 | Greywal |
| 6,358,021 B1 | 3/2002 | Cabuz |
| 6,391,675 B1 | 5/2002 | Ehmke et al. |
| 6,407,851 B1 | 6/2002 | Islam et al. |
| 6,433,917 B1 | 8/2002 | Mei et al. |
| 6,446,486 B1 | 9/2002 | deBoer et al. |
| 6,447,126 B1 | 9/2002 | Hornbeck |
| 6,449,084 B1 | 9/2002 | Guo |
| 6,456,420 B1 | 9/2002 | Goodwin-Johansson |
| 6,465,355 B1 | 10/2002 | Horsley |
| 6,466,354 B1 | 10/2002 | Gudeman |
| 6,473,072 B1 | 10/2002 | Comiskey et al. |
| 6,473,274 B1 | 10/2002 | Maimone et al. |
| 6,513,911 B1 | 2/2003 | Ozaki et al. |
| 6,522,801 B1 | 2/2003 | Aksyuk et al. |
| 6,537,427 B1 | 3/2003 | Raina et al. |
| 6,574,033 B1 | 6/2003 | Chui et al. |
| 6,577,785 B1 | 6/2003 | Spahn et al. |
| 6,597,490 B2 | 7/2003 | Tayebati |
| 6,602,791 B2 | 8/2003 | Ouellet et al. |
| 6,618,187 B2 | 9/2003 | Pilossof |
| 6,625,047 B2 | 9/2003 | Coleman, Jr. |
| 6,632,698 B2 | 10/2003 | Ives |
| 6,635,919 B1 | 10/2003 | Melendez et al. |
| 6,642,913 B1 | 11/2003 | Kimura et al. |
| 6,650,455 B2 | 11/2003 | Miles |
| 6,653,997 B2 | 11/2003 | Van Gorkom et al. |
| 6,657,832 B2 | 12/2003 | Williams et al. |
| 6,666,561 B1 | 12/2003 | Blakley |
| 6,674,562 B1 | 1/2004 | Miles |
| 6,677,225 B1 | 1/2004 | Ellis et al. |
| 6,680,792 B2 | 1/2004 | Miles |
| 6,704,475 B2 | 3/2004 | Jin et al. |
| 6,710,908 B2 | 3/2004 | Miles et al. |
| 6,713,235 B1 | 3/2004 | Ide et al. |
| 6,741,383 B2 | 5/2004 | Huibers et al. |
| 6,760,146 B2 | 7/2004 | Ikeda et al. |
| 6,778,306 B2 | 8/2004 | Sniegowski et al. |
| 6,778,728 B2 | 8/2004 | Taylor |
| 6,788,175 B1 | 9/2004 | Prophet et al. |
| 6,794,119 B2 | 9/2004 | Miles |
| 6,803,534 B1 | 10/2004 | Chen et al. |
| 6,859,301 B1 | 2/2005 | Islam et al. |
| 6,867,896 B2 | 3/2005 | Miles |
| 6,881,535 B2 | 4/2005 | Yamaguchi |
| 6,882,458 B2 | 4/2005 | Lin et al. |

| Patent No. | Date | Inventor |
|---|---|---|
| 6,940,631 B2 | 9/2005 | Ishikawa |
| 6,952,304 B2 | 10/2005 | Mushika et al. |
| 6,958,847 B2 | 10/2005 | Lin |
| 6,967,757 B1 | 11/2005 | Allen et al. |
| 6,972,891 B2 | 12/2005 | Patel et al. |
| 6,980,350 B2 | 12/2005 | Hung et al. |
| 6,982,820 B2 | 1/2006 | Tsai |
| 6,987,432 B2 | 1/2006 | Lutz et al. |
| 6,991,995 B2 | 1/2006 | Aulnette et al. |
| 6,995,890 B2 | 2/2006 | Lin |
| 7,006,272 B2 | 2/2006 | Tsai |
| 7,016,095 B2 | 3/2006 | Lin |
| 7,016,099 B2 | 3/2006 | Ikeda et al. |
| 7,027,202 B1 | 4/2006 | Hunter et al. |
| 7,041,571 B2 | 5/2006 | Strane |
| 7,042,619 B1 | 5/2006 | McGinley et al. |
| 7,042,643 B2 | 5/2006 | Miles et al. |
| 7,053,737 B2 | 5/2006 | Schwartz et al. |
| 7,075,700 B2 | 7/2006 | Muenter |
| 7,078,293 B2 | 7/2006 | Lin et al. |
| 7,110,158 B2 | 9/2006 | Miles |
| 7,119,945 B2 | 10/2006 | Cummings et al. |
| 7,123,216 B1 | 10/2006 | Miles |
| 7,161,730 B2 | 1/2007 | Floyd |
| 7,193,768 B2 | 3/2007 | Lin |
| 7,198,973 B2 | 4/2007 | Lin et al. |
| 7,233,029 B2 | 6/2007 | Mochizuki |
| 7,250,315 B2 | 7/2007 | Miles |
| 7,289,259 B2 | 10/2007 | Chui et al. |
| 7,321,457 B2 | 1/2008 | Heald |
| 7,327,510 B2 | 2/2008 | Cummings et al. |
| 7,417,784 B2 | 8/2008 | Sasagawa et al. |
| 2001/0003487 A1 | 6/2001 | Miles |
| 2001/0010953 A1 | 8/2001 | Kang et al. |
| 2001/0026951 A1 | 10/2001 | Vergani et al. |
| 2001/0028503 A1 | 10/2001 | Flanders et al. |
| 2001/0040675 A1 | 11/2001 | True et al. |
| 2001/0055208 A1 | 12/2001 | Kimura |
| 2002/0027636 A1 | 3/2002 | Yamada |
| 2002/0031155 A1 | 3/2002 | Tayebati et al. |
| 2002/0054422 A1 | 5/2002 | Carr et al. |
| 2002/0055253 A1 | 5/2002 | Rudhard |
| 2002/0058422 A1 | 5/2002 | Jang et al. |
| 2002/0071169 A1 | 6/2002 | Bowers et al. |
| 2002/0075555 A1 | 6/2002 | Miles |
| 2002/0109899 A1 | 8/2002 | Ohtaka et al. |
| 2002/0110948 A1 | 8/2002 | Huang et al. |
| 2002/0131682 A1 | 9/2002 | Nasiri et al. |
| 2002/0135857 A1 | 9/2002 | Fitzpatrick et al. |
| 2002/0141690 A1 | 10/2002 | Jin et al. |
| 2002/0146200 A1 | 10/2002 | Kudric et al. |
| 2002/0149850 A1 | 10/2002 | Heffner et al. |
| 2002/0168136 A1 | 11/2002 | Atia et al. |
| 2002/0186483 A1 | 12/2002 | Hagelin et al. |
| 2002/0195681 A1 | 12/2002 | Melendez et al. |
| 2003/0015936 A1 | 1/2003 | Yoon et al. |
| 2003/0016428 A1 | 1/2003 | Kato et al. |
| 2003/0029705 A1 | 2/2003 | Qiu et al. |
| 2003/0036215 A1 | 2/2003 | Reid |
| 2003/0053078 A1 | 3/2003 | Missey et al. |
| 2003/0053233 A1 | 3/2003 | Felton |
| 2003/0072070 A1 | 4/2003 | Miles |
| 2003/0090350 A1 | 5/2003 | Feng et al. |
| 2003/0091072 A1 | 5/2003 | Wang et al. |
| 2003/0112096 A1 | 6/2003 | Potter |
| 2003/0119221 A1 | 6/2003 | Cunningham et al. |
| 2003/0123125 A1* | 7/2003 | Little ............ 359/290 |
| 2003/0123126 A1 | 7/2003 | Meyer et al. |
| 2003/0138213 A1 | 7/2003 | Jiin et al. |
| 2003/0156315 A1 | 8/2003 | Li et al. |
| 2003/0164350 A1 | 9/2003 | Hanson et al. |
| 2003/0201784 A1 | 10/2003 | Potter |
| 2003/0202264 A1 | 10/2003 | Weber et al. |
| 2003/0202265 A1 | 10/2003 | Reboa et al. |
| 2003/0210851 A1 | 11/2003 | Fu et al. |
| 2003/0231373 A1 | 12/2003 | Kowarz et al. |
| 2004/0008396 A1 | 1/2004 | Stappaerts |
| 2004/0008438 A1 | 1/2004 | Sato |
| 2004/0027671 A1 | 2/2004 | Wu et al. |
| 2004/0035821 A1 | 2/2004 | Doan et al. |
| 2004/0051929 A1 | 3/2004 | Sampsell et al. |
| 2004/0056742 A1 | 3/2004 | Dabbaj |
| 2004/0058532 A1 | 3/2004 | Miles et al. |
| 2004/0070813 A1 | 4/2004 | Aubuchon |
| 2004/0080035 A1 | 4/2004 | Delapierre |
| 2004/0080807 A1 | 4/2004 | Chen et al. |
| 2004/0100677 A1 | 5/2004 | Huibers et al. |
| 2004/0100680 A1 | 5/2004 | Huibers et al. |
| 2004/0124073 A1 | 7/2004 | Pilans et al. |
| 2004/0125281 A1 | 7/2004 | Lin et al. |
| 2004/0125347 A1 | 7/2004 | Patel et al. |
| 2004/0136045 A1 | 7/2004 | Tran |
| 2004/0136076 A1 | 7/2004 | Tayebati |
| 2004/0150869 A1 | 8/2004 | Kasai |
| 2004/0160143 A1 | 8/2004 | Shreeve et al. |
| 2004/0174583 A1 | 9/2004 | Chen et al. |
| 2004/0191937 A1 | 9/2004 | Patel et al. |
| 2004/0201908 A1 | 10/2004 | Kaneko |
| 2004/0207497 A1 | 10/2004 | Hsu et al. |
| 2004/0207898 A1 | 10/2004 | Lin et al. |
| 2004/0209195 A1 | 10/2004 | Lin |
| 2004/0217919 A1 | 11/2004 | Pichl et al. |
| 2004/0218251 A1 | 11/2004 | Piehl et al. |
| 2004/0226909 A1 | 11/2004 | Tzeng |
| 2004/0233498 A1 | 11/2004 | Starkweather et al. |
| 2004/0240032 A1 | 12/2004 | Miles |
| 2005/0024557 A1 | 2/2005 | Lin |
| 2005/0036095 A1 | 2/2005 | Yeh et al. |
| 2005/0038950 A1 | 2/2005 | Adelmann |
| 2005/0046919 A1 | 3/2005 | Taguchi et al. |
| 2005/0046922 A1 | 3/2005 | Lin et al. |
| 2005/0078348 A1 | 4/2005 | Lin |
| 2005/0128565 A1 | 6/2005 | Ljungblad |
| 2005/0195464 A1 | 9/2005 | Faase et al. |
| 2005/0249966 A1 | 11/2005 | Tung et al. |
| 2006/0006138 A1 | 1/2006 | Lin |
| 2006/0018348 A1 | 1/2006 | Przybyla et al. |
| 2006/0024620 A1 | 2/2006 | Nikkel et al. |
| 2006/0024880 A1 | 2/2006 | Chui et al. |
| 2006/0066511 A1 | 3/2006 | Chui |
| 2006/0066932 A1 | 3/2006 | Chui |
| 2006/0066936 A1 | 3/2006 | Chui et al. |
| 2006/0076311 A1 | 4/2006 | Tung et al. |
| 2006/0077502 A1 | 4/2006 | Tung et al. |
| 2006/0077509 A1 | 4/2006 | Tung et al. |
| 2006/0077518 A1 | 4/2006 | Chui et al. |
| 2006/0079048 A1 | 4/2006 | Sampsell et al. |
| 2006/0119922 A1 | 6/2006 | Faase et al. |
| 2006/0203325 A1 | 9/2006 | Faase et al. |
| 2006/0256420 A1 | 11/2006 | Miles et al. |
| 2007/0019280 A1 | 1/2007 | Sasagawa et al. |
| 2007/0019923 A1 | 1/2007 | Sasagawa et al. |
| 2007/0041076 A1 | 2/2007 | Zhong et al. |
| 2007/0041703 A1 | 2/2007 | Wang |
| 2007/0042524 A1 | 2/2007 | Kogut et al. |
| 2007/0047900 A1 | 3/2007 | Sampsell et al. |
| 2007/0064760 A1 | 3/2007 | Kragh |
| 2007/0096300 A1 | 5/2007 | Wang et al. |
| 2007/0170540 A1 | 7/2007 | Chung et al. |
| 2007/0247401 A1 | 10/2007 | Sasagawa et al. |
| 2007/0249079 A1 | 10/2007 | Sasagawa et al. |
| 2007/0269748 A1 | 11/2007 | Miles |
| 2007/0279753 A1 | 12/2007 | Tung et al. |
| 2008/0026328 A1 | 1/2008 | Miles |
| 2008/0030825 A1 | 2/2008 | Sasagawa et al. |
| 2008/0041817 A1 | 2/2008 | Lin |

| | | | |
|---|---|---|---|
| 2008/0055699 | A1 | 3/2008 | Lin |
| 2008/0068699 | A1 | 3/2008 | Miles |
| 2008/0144163 | A1 | 6/2008 | Floyd |
| 2008/0226929 | A1 | 9/2008 | Chung et al. |

FOREIGN PATENT DOCUMENTS

| | | |
|---|---|---|
| CN | 092109265 | 4/2003 |
| DE | 10228946 | 1/2004 |
| DE | 198 47 455 | 4/2004 |
| EP | 0 069 226 | 1/1983 |
| EP | 0 035 299 | 9/1983 |
| EP | 0 695 959 | 2/1996 |
| EP | 0 788 005 | 8/1997 |
| EP | 1 170 618 | 1/2002 |
| EP | 1 197 778 | 4/2002 |
| EP | 1 275 997 | 1/2003 |
| EP | 1 473 691 | 11/2004 |
| EP | 1 484 635 | 12/2004 |
| FR | 2824643 | 10/1999 |
| JP | 06301054 | 10/1994 |
| JP | 08293580 | 11/1996 |
| JP | 9-127439 | 5/1997 |
| JP | 11-097799 | 4/1999 |
| JP | 2001-085519 | 3/2001 |
| JP | 2002-062490 | 2/2002 |
| JP | 2002-207182 | 7/2002 |
| JP | 2002-277771 | 9/2002 |
| JP | 2002-341267 | 11/2002 |
| JP | 2003-021798 | 1/2003 |
| JP | 2003-215475 | 7/2003 |
| JP | 2003195201 | 7/2003 |
| JP | 2004157527 | 6/2004 |
| JP | 2004-212656 | 7/2004 |
| WO | WO 02/38491 | 5/2002 |
| WO | WO 02/079853 | 10/2002 |
| WO | WO 03/014789 | 2/2003 |
| WO | WO 03/052506 | 6/2003 |
| WO | WO 2004/000717 | 12/2003 |
| WO | WO 2004/015741 | 2/2004 |
| WO | WO 2004/055885 | 7/2004 |
| WO | WO 2005/006364 | 1/2005 |
| WO | WO 2005/066596 | 7/2005 |

OTHER PUBLICATIONS

Aratani K. et al. "Surface Micromachined Tuneable Interferometer Array," Sensors and Actuators A, Elsevier Sequoia S.A., Lausanne, CH, vol. A43, No. 1/3, May 1, 1994, pp. 17-23.

Chiou et al., "A Novel Capacitance Control Design of Tunable Capacitor Using Multiple Electrostatic Driving Electrodes," IEEE NANO 2001, M 3.1, Nanoelectronics and Giga-Scale Systems (Special Session), Oct. 29, 2001, pp. 319-324.

Fan et al., "Channel Drop Filters in Photonic Crystals," Optics Express, vol. 3, No. 1 (1998).

Fork, et al., "P-67: Chip on Glass Bonding using StressedMetal™ Technology" Sid 05 Digest, May 24, 2005.

Goossen et al., "Possible Display Applications of the Silicon Mechanical Anti-Reflection Switch," Society for Information Display (1994).

Joannopoulos et al., "Photonic Crystals: Molding the Flow of Light," Princeton University Press (1995).

Lin et al., "Free-Space Micromachined Optical Switches for Optical Networking," IEEE Journal of Selected Topics in Quantum Electronics, vol. 5, No. 1, pp. 4-9. (Jan./Feb. 1999).

Magel, "Integrated Optic Devices Using Micromachined Metal Membranes," SPIE vol. 2686, 0-8194-2060-Mar. 1996.

Raley et al., "A Fabry-Perot Microinterferometer for Visible Wavelengths," IEEE Solid-State Sensor and Actuator Workshop, Hilton Head, SC, pp. 170-173 (1992).

Wang et al., Flexible curcuit-based RF MEMS Switches, Proceedings of 2001 ASME International Mechanical Engineering Congress and Exposition, pp. 1-6, 2001.

Dai et al., "A CMOS surface micromachined pressure sensor," Journal of the Chinese institute of Engineers, 1999, vol. 22, No. 3 (May), pp. 375-380.

Lee et al., "Improvement of the surface characteristics of sputtered metal layer for a MEMS micro-mirror switch," Thin Solid Films, vol. 447, Jan. 30, 2004, pp. 615-618.

ISR and WO for PCT/US07/021046, filed Sep. 28, 2007.

* cited by examiner

|  | Column Output Signals | |
|---|---|---|
|  | $+V_{bias}$ | $-V_{bias}$ |
| Row Output Signals  0 | Stable | Stable |
| $+\Delta V$ | Relax | Actuate |
| $-\Delta V$ | Actuate | Relax |

SACRIFICIAL SPACER PROCESS AND RESULTANT STRUCTURE FOR MEMS SUPPORT STRUCTURE

BACKGROUND OF THE INVENTION

1. Field of the Invention

This invention relates to microelectromechanical systems. More particularly, this invention relates to methods and apparatus for improving the performance of microelectromechanical systems such as interferometric modulators.

2. Description of the Related Art

Microelectromechanical systems (MEMS) include micro mechanical elements, actuators, and electronics. Micromechanical elements may be created using deposition, etching, and or other micromachining processes that etch away parts of substrates and/or deposited material layers or that add layers to form electrical and electromechanical devices. One type of MEMS device is called an interferometric modulator. As used herein, the term interferometric modulator or interferometric light modulator refers to a device that selectively absorbs and/or reflects light using the principles of optical interference. In certain embodiments, an interferometric modulator may comprise a pair of conductive plates, one or both of which may be transparent and/or reflective in whole or part and capable of relative motion upon application of an appropriate electrical signal. In a particular embodiment, one plate may comprise a stationary layer deposited on a substrate and the other plate may comprise a metallic membrane separated from the stationary layer by an air gap or cavity. As described herein in more detail, the position of one plate in relation to another can change the optical interference of light incident on the interferometric modulator. Such devices have a wide range of applications, and it would be beneficial in the art to utilize and/or modify the characteristics of these types of devices so that their features can be exploited in improving existing products and creating new products that have not yet been developed.

SUMMARY OF THE INVENTION

The systems, methods, and devices of the invention each have several aspects, no single one of which is solely responsible for its desirable attributes. Without limiting the scope of this invention, its more prominent features will now be discussed briefly. After considering this discussion, and particularly after reading the section entitled "Detailed Description of Certain Embodiments" one will understand how the features of this invention provide advantages over other display devices.

An aspect provides a method of making a microelectromechanical system (MEMS) device. This method includes forming a conductive layer over a first sacrificial layer, patterning a movable conductor from the conductive layer, forming a sidewall spacer on a sidewall of the movable conductor, and forming a deformable layer over the movable conductor, wherein the deformable layer attaches to the movable conductor at one or more points.

Another aspect provides a method of making an interferometric modulator. This method includes forming an electrode over a substrate, wherein the electrode is at least partially transparent, forming a first sacrificial layer over the electrode, forming a reflective layer over the first sacrificial layer, patterning a movable mirror from the reflective layer, and forming a sacrificial spacer on a sidewall of the movable mirror.

Another aspect provides a microelectromechanical systems (MEMS) device. This device includes a substrate, a deformable layer, a plurality of support structures arranged over the substrate and configured to support the deformable layer, and a cavity defined by the substrate, the support structures, and the deformable layer. This device further includes a movable conductor disposed within the cavity, wherein the movable conductor is secured to the deformable layer, and wherein the movable conductor comprises a side wall with an inward reentrant region. The deformable layer comprises an upwardly convex surface proximal to the inward reentrant region of the sidewall of the movable conductor.

Another aspect provides an interferometric modulator. The interferometric modulator includes a substrate, an optical stack over the substrate, a deformable layer, and a plurality of support structures arranged over the substrate and configured to support the deformable layer. The interferometric modulator further includes a cavity defined by the optical stack, the support structures, and the deformable layer, and a movable mirror disposed within the cavity, wherein the movable mirror is secured to the deformable layer, and wherein a cavity ceiling spaced above an edge of the mirror comprises a step transitioning toward the substrate and defining a lower corner at the bottom of the step. A distance measured from a sidewall of the movable mirror to the lower corner of the ceiling step is more than 25 percent greater than a distance from an upper surface of the movable mirror to the cavity ceiling above the edge of the mirror when the interferometric modulator is in a relaxed condition.

The Figures are schematic only, not drawn to scale.

DETAILED DESCRIPTION OF THE PREFERRED EMBODIMENT

The following detailed description is directed to certain specific embodiments of the invention. However, the invention can be embodied in a multitude of different ways. In this description, reference is made to the drawings wherein like parts are designated with like numerals throughout. As will be apparent from the following description, the embodiments may be implemented in any device that is configured to display an image, whether in motion (e.g., video) or stationary (e.g., still image), and whether textual or pictorial. More particularly, it is contemplated that the embodiments may be implemented in or associated with a variety of electronic devices such as, but not limited to, mobile telephones, wireless devices, personal data assistants (PDAs), hand-held or portable computers, GPS receivers/navigators, cameras, MP3 players, camcorders, game consoles, wrist watches, clocks, calculators, television monitors, flat panel displays, computer monitors, auto displays (e.g., odometer display, etc.), cockpit controls and/or displays, display of camera views (e.g., display of a rear view camera in a vehicle), electronic photographs, electronic billboards or signs, projectors, architectural structures, packaging, and aesthetic structures (e.g., display of images on a piece of jewelry). MEMS devices of similar structure to those described herein can also be used in non-display applications such as in electronic switching devices.

Embodiments described herein provide MEMS devices and particularly interferometric modulator devices and methods of making the same with improved performance. The interferometric modulator includes a sidewall spacer formed adjacent to a movable mirror. The sidewall spacer may be a sacrificial spacer that is removed during fabrication, or it may remain in the final product, depending on the embodiment. In one aspect, increased clearance is provided between the movable mirror and an overlying layer during actuation of the movable mirror, particularly at the corners of the mirror, thereby avoiding contact during operation of the interferometric modulator. In another aspect, the deformable layer may be deposited more reliably in a continuous fashion over the contour of a lower layer as determined by the contour of the sidewall spacer, resulting in a stronger and more resilient deformable layer.

Figure 1:
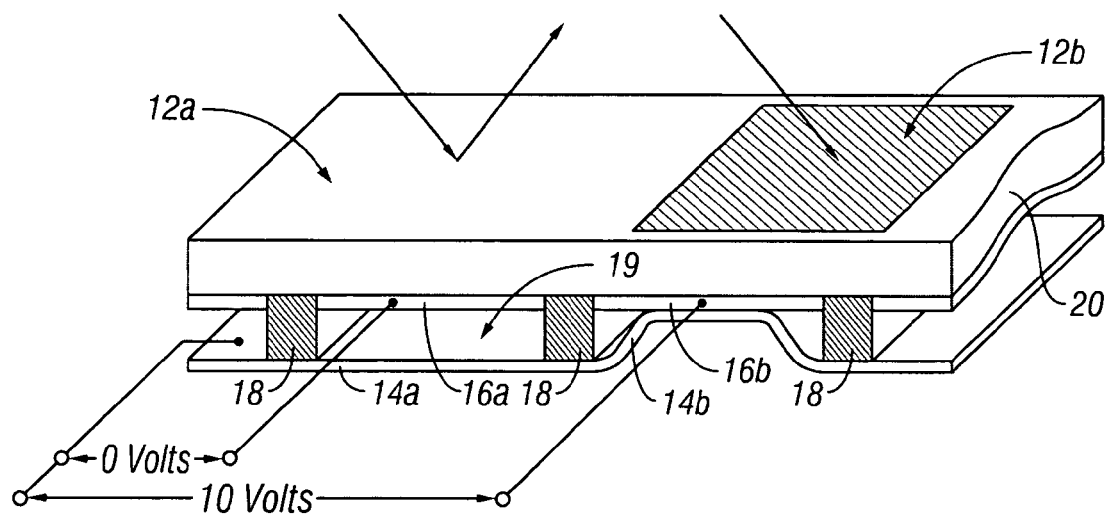
FIG. 1 is an isometric view depicting a portion of one embodiment of an modulator display in which a movable reflective layer of a first interferometric modulator is in a relaxed position and a movable reflective layer of a second interferometric modulator is in an actuated position.

One interferometric modulator display embodiment comprising an interferometric MEMS display element is illustrated in FIG. 1. In these devices, the pixels are in either a bright or dark state. In the bright ("on" or "open") state, the display element reflects a large portion of incident visible light to a user. When in the dark ("off" or "closed") state, the display element reflects little incident visible light to the user. Depending on the embodiment, the light reflectance properties of the "on" and "off" states may be reversed. MEMS pixels can be configured to reflect predominantly at selected colors, allowing for a color display in addition to black and white.

FIG. 1 is an isometric view depicting two adjacent pixels in a series of pixels of a visual display, wherein each pixel comprises a MEMS interferometric modulator. In some embodiments, an interferometric modulator display comprises a row/column array of these interferometric modulators. Each interferometric modulator includes a pair of reflective layers positioned at a variable and controllable distance from each other to form a resonant optical cavity with at least one variable dimension. In one embodiment, one of the reflective layers may be moved between two positions. In the first position, referred to herein as the relaxed position, the movable reflective layer is positioned at a relatively large distance from a fixed partially reflective layer. In the second position, referred to herein as the actuated position, the movable reflective layer is positioned more closely adjacent to the partially reflective layer. Incident light that reflects from the two layers interferes constructively or destructively depending on the position of the movable reflective layer, producing either an overall reflective or non-reflective state for each pixel.

The depicted portion of the pixel array in FIG. 1 includes two adjacent interferometric modulators 12a and 12b. In the interferometric modulator 12a on the left, a movable reflective layer 14a is illustrated in a relaxed position at a predetermined distance from an optical stack 16a, which includes a partially reflective layer. In the interferometric modulator 12b on the right, the movable reflective layer 14b is illustrated in an actuated position adjacent to the optical stack 16b.

The optical stacks 16a and 16b (collectively referred to as optical stack 16), as referenced herein, typically comprise of several fused layers, which can include an electrode layer, such as indium tin oxide (ITO), a partially reflective layer, such as chromium, and a transparent dielectric. The optical stack 16 is thus electrically conductive, partially transparent and partially reflective, and may be fabricated, for example, by depositing one or more of the above layers onto a transparent substrate 20. The partially reflective layer can be formed from a variety of materials that are partially reflective such as various metals, semiconductors, and dielectrics. The partially reflective layer can be formed of one or more layers of materials, and each of the layers can be formed of a single material or a combination of materials.

In some embodiments, the layers of the optical stack are patterned into parallel strips, and may form row electrodes in a display device as described further below. The movable reflective layers 14a, 14b may be formed as a series of parallel strips of a deposited metal layer or layers (orthogonal to the row electrodes of 16a, 16b) deposited on top of posts 18 and an intervening sacrificial material deposited between the posts 18. When the sacrificial material is etched away, the movable reflective layers 14a, 14b are separated from the optical stacks 16a, 16b by a defined gap 19. A highly conductive and reflective material such as aluminum may be used for the reflective layers 14, and these strips may form column electrodes in a display device.

With no applied voltage, the cavity 19 remains between the movable reflective layer 14a and optical stack 16a, with the movable reflective layer 14a in a mechanically relaxed state, as illustrated by the pixel 12a in FIG. 1. However, when a potential difference is applied to a selected row and column, the capacitor formed at the intersection of the row and column electrodes at the corresponding pixel becomes charged, and electrostatic forces pull the electrodes together. If the voltage is high enough, the movable reflective layer 14 is deformed and is forced against the optical stack 16. A dielectric layer (not illustrated in this Figure) within the optical stack 16 may prevent shorting and control the separation distance between layers 14 and 16, as illustrated by pixel 12b on the right in FIG. 1. The behavior is the same regardless of the polarity of the applied potential difference. In this way, row/column actuation that can control the reflective vs. non-reflective pixel states is analogous in many ways to that used in conventional LCD and other display technologies.

FIGS. 2 through 5B illustrate one exemplary process and system for using an array of interferometric modulators in a display application.

Figure 2:
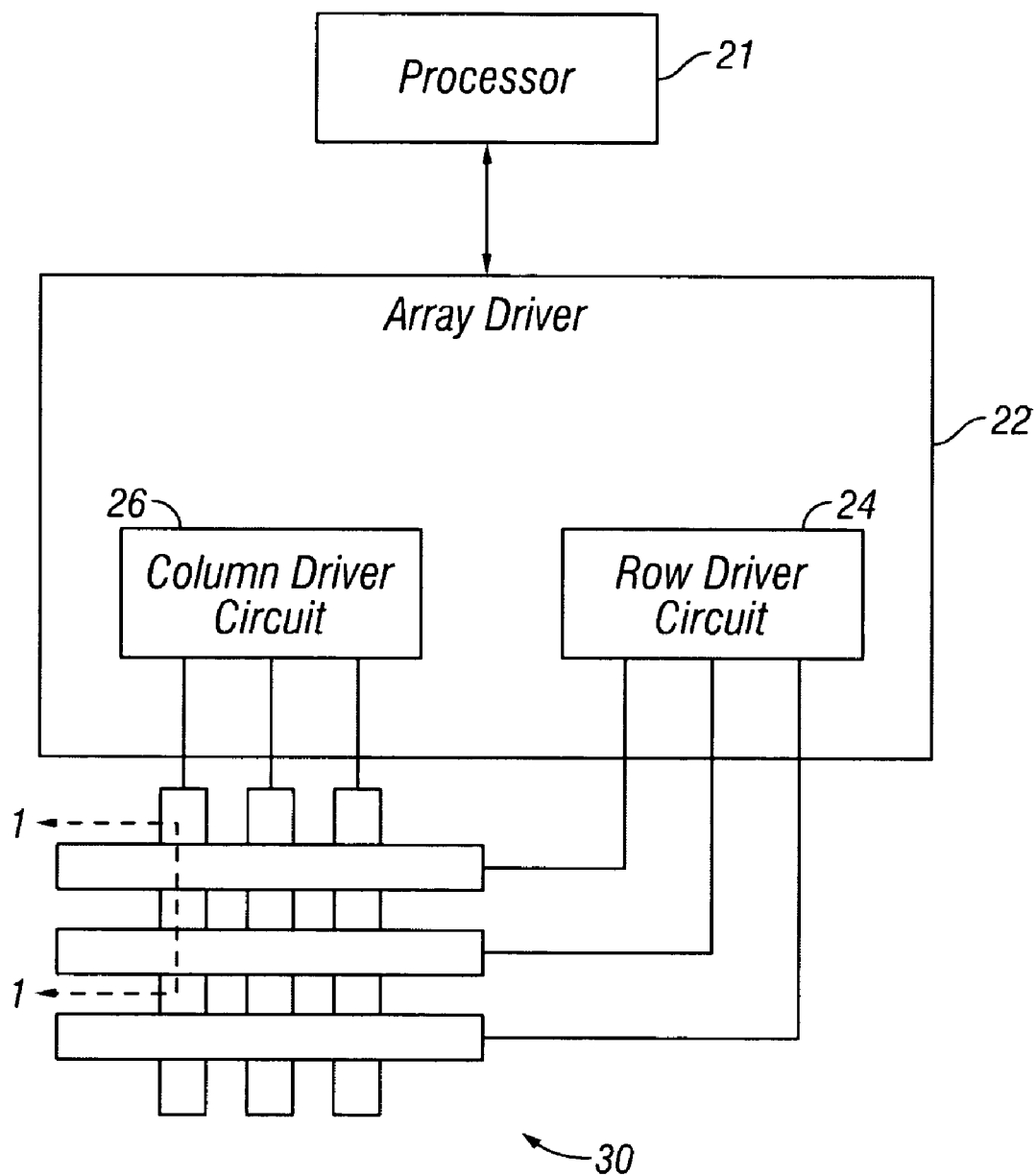
FIG. 2 is a system block diagram illustrating one embodiment of an electronic device incorporating a 3×3 interferometric modulator display.

FIG. 2 is a system block diagram illustrating one embodiment of an electronic device that may incorporate aspects of the invention. In the exemplary embodiment, the electronic device includes a processor 21 which may be any general purpose single- or multi-chip microprocessor such as an ARM, Pentium®, Pentium®, Pentium®, Pentium IV®, Pentium® Pro, an 8051, a MIPS®, a Power PC®, an ALPHA®, or any special purpose microprocessor such as a digital signal processor, micro controller, or a programmable gate array. As is conventional in the art, the processor 21 may be configured to execute one or more software modules. In addition to executing an operating system, the processor may be configured to execute one or more software applications, including a web browser, a telephone application, an email program, or any other software application.

In one embodiment, the processor 21 is also configured to communicate with an array driver 22. In one embodiment, the array driver 22 includes a row driver circuit 24 and a column driver circuit 26 that provide signals to a display array or panel 30. The cross section of the array illustrated in FIG. 1 is shown by the lines 1-1 in FIG. 2. For MEMS interferometric modulators, the row/column actuation protocol may take advantage of a hysteresis property of these devices illustrated in FIG. 3. It may require, for example, a 10 volt potential difference to cause a movable layer to deform from the relaxed state to the actuated state. However, when the voltage is reduced from that value, the movable layer maintains its state as the voltage drops back below 10 volts. In the exemplary embodiment of FIG. 3, the movable layer does not relax completely until the voltage drops below 2 volts. There is thus a range of voltage, about 3 to 7 V in the example illustrated in FIG. 3, where there exists a window of applied voltage within which the device is stable in either the relaxed or actuated state. This is referred to herein as the "hysteresis window" or "stability window." For a display array having the hysteresis characteristics of FIG. 3, the row/column actuation protocol can be designed such that during row strobing, pixels in the strobed row that are to be actuated are exposed to a voltage difference of about 10 volts, and pixels that are to be relaxed are exposed to a voltage difference of close to zero volts. After the strobe, the pixels are exposed to a steady state voltage difference of about 5 volts such that they remain in whatever state the row strobe put them in. After being written, each pixel sees a potential difference within the "stability window" of 3-7 volts in this example. This feature makes the pixel design illustrated in FIG. 1 stable under the same applied voltage conditions in either an actuated or relaxed pre-existing state. Since each pixel of the interferometric modulator, whether in the actuated or relaxed state, is essentially a capacitor formed by the fixed and moving reflective layers, this stable state can be held at a voltage within the hysteresis window with almost no power dissipation. Essentially no current flows into the pixel if the applied potential is fixed.

In typical applications, a display frame may be created by asserting the set of column electrodes in accordance with the desired set of actuated pixels in the first row. A row pulse is then applied to the row 1 electrode, actuating the pixels corresponding to the asserted column lines. The asserted set of column electrodes is then changed to correspond to the desired set of actuated pixels in the second row. A pulse is then applied to the row 2 electrode, actuating the appropriate pixels in row 2 in accordance with the asserted column electrodes. The row 1 pixels are unaffected by the row 2 pulse, and remain in the state they were set to during the row 1 pulse. This may be repeated for the entire series of rows in a sequential fashion to produce the frame. Generally, the frames are refreshed and/or updated with new display data by continually repeating this process at some desired number of frames per second. A wide variety of protocols for driving row and column electrodes of pixel arrays to produce display frames are also well known and may be used in conjunction with the present invention.

Figures 3, 4:
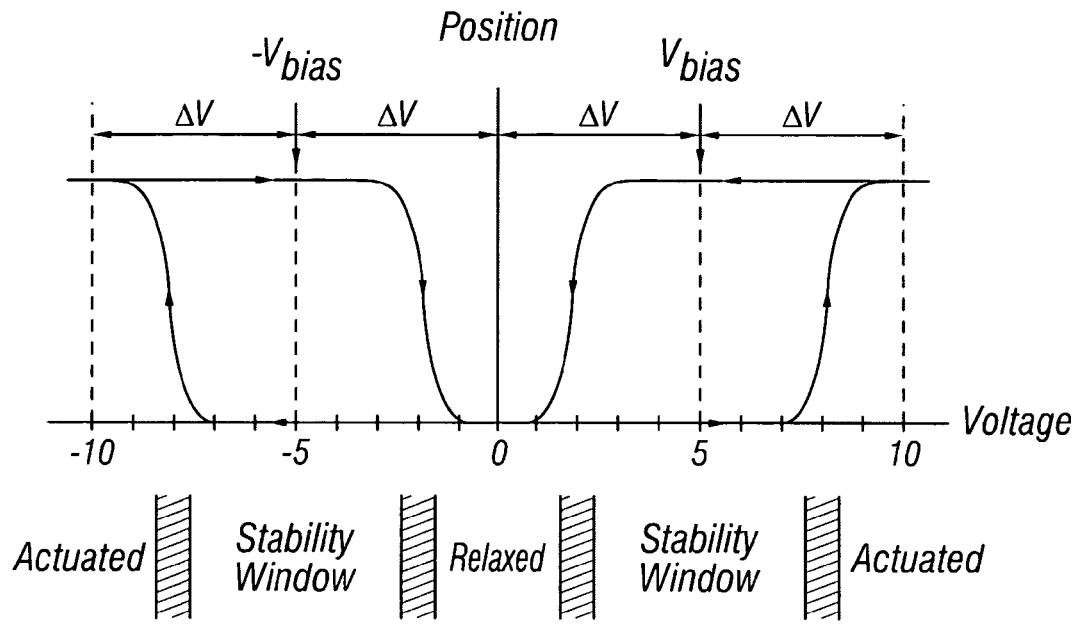
FIG. 3 is a diagram of movable mirror position versus applied voltage for one exemplary embodiment of an interferometric modulator of FIG. 1.
FIG. 4 is an illustration of a set of row and column voltages that may be used to drive an interferometric modulator display.
Figure 5A:
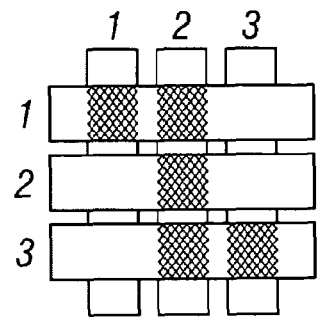
FIG. 5A illustrates one exemplary frame of display data in the 3×3 interferometric modulator display of FIG. 2.
Figure 5B:
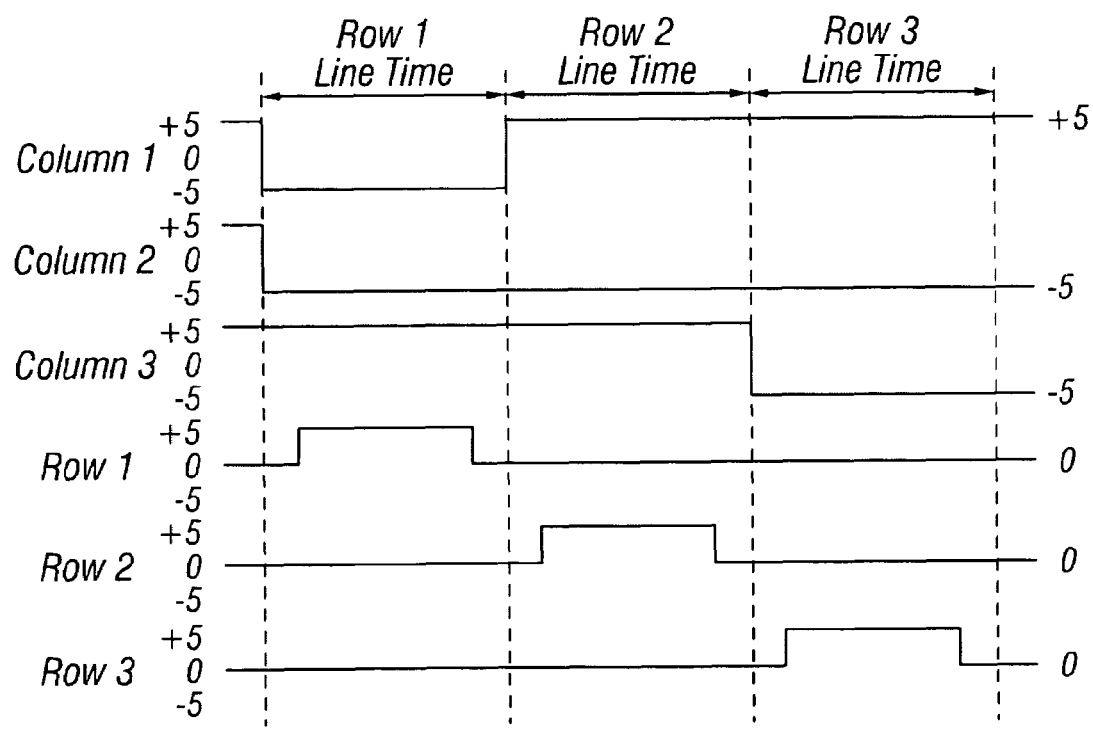
FIG. 5B illustrates one exemplary timing diagram for row and column signals that may be used to write the frame of FIG. 5A.

FIGS. 4, 5A, and 5B illustrate one possible actuation protocol for creating a display frame on the 3×3 array of FIG. 2. FIG. 4 illustrates a possible set of column and row voltage levels that may be used for pixels exhibiting the hysteresis curves of FIG. 3. In the FIG. 4 embodiment, actuating a pixel involves setting the appropriate column to $-V_{bias}$, and the appropriate row to $+\Delta V$, which may correspond to $-5$ volts and $+5$ volts respectively Relaxing the pixel is accomplished by setting the appropriate column to $+V_{bias}$, and the appropriate row to the same $+\Delta V$, producing a zero volt potential difference across the pixel. In those rows where the row voltage is held at zero volts, the pixels are stable in whatever state they were originally in, regardless of whether the column is at $+V_{bias}$, or $-V_{bias}$. As is also illustrated in FIG. 4, it will be appreciated that voltages of opposite polarity than those described above can be used, e.g., actuating a pixel can involve setting the appropriate column to $+V_{bias}$, and the appropriate row to $-\Delta V$. In this embodiment, releasing the pixel is accomplished by setting the appropriate column to $-V_{bias}$, and the appropriate row to the same $-\Delta V$, producing a zero volt potential difference across the pixel.

FIG. 5B is a timing diagram showing a series of row and column signals applied to the 3×3 array of FIG. 2 which will result in the display arrangement illustrated in FIG. 5A, where actuated pixels are non-reflective. Prior to writing the frame illustrated in FIG. 5A, the pixels can be in any state, and in this example, all the rows are at 0 volts, and all the columns are at +5 volts. With these applied voltages, all pixels are stable in their existing actuated or relaxed states.

In the FIG. 5A frame, pixels (1,1), (1,2), (2,2), (3,2) and (3,3) are actuated. To accomplish this, during a "line time" for row 1, columns 1 and 2 are set to −5 volts, and column 3 is set to +5 volts. This does not change the state of any pixels, because all the pixels remain in the 3-7 volt stability window. Row 1 is then strobed with a pulse that goes from 0, up to S volts, and back to zero. This actuates the (1,1) and (1,2) pixels and relaxes the (1,3) pixel. No other pixels in the array are affected. To set row 2 as desired, column 2 is set to −5 volts, and columns 1 and 3 are set to +5 volts. The same strobe applied to row 2 will then actuate pixel (2,2) and relax pixels (2,1) and (2,3). Again, no other pixels of the array are affected. Row 3 is similarly set by setting columns 2 and 3 to −5 volts, and column 1 to +5 volts. The row 3 strobe sets the row 3 pixels as shown in FIG. 5A. After writing the frame, the row potentials are zero, and the column potentials can remain at either +5 or −5 volts, and the display is then stable in the arrangement of FIG. 5A. It will be appreciated that the same procedure can be employed for arrays of dozens or hundreds of rows and columns. It will also be appreciated that the timing, sequence, and levels of voltages used to perform row and column actuation can be varied widely within the general principles outlined above, and the above example is exemplary only, and any actuation voltage method can be used with the systems and methods described herein.

Figure 6A:
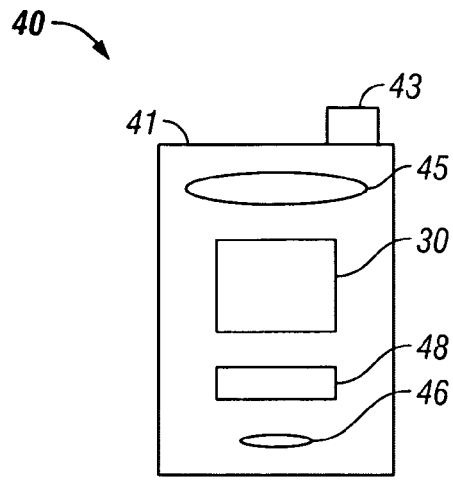
FIGS. 6A and 6B are system block diagrams illustrating an embodiment of a visual display device comprising a plurality of interferometric modulators.
Figure 6B:
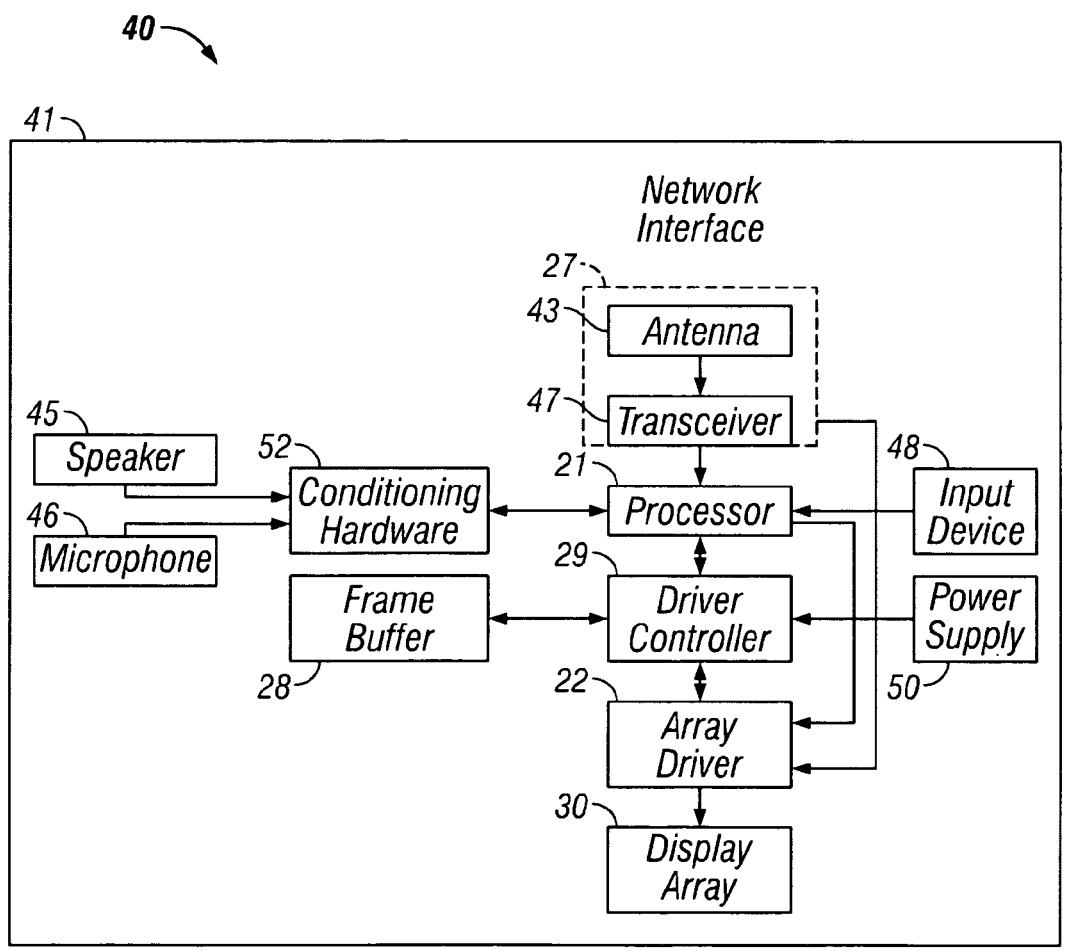

FIGS. 6A and 6B are system block diagrams illustrating an embodiment of a display device 40. The display device 40 can be, for example, a cellular or mobile telephone. However, the same components of display device 40 or slight variations thereof are also illustrative of various types of display devices such as televisions and portable media players.

The display device 40 includes a housing 41, a display 30, an antenna 43, a speaker 45, an input device 48, and a microphone 46. The housing 41 is generally formed from any of a variety of manufacturing processes as are well known to those of skill in the art, including injection molding, and vacuum forming. In addition, the housing 41 may be made from any of a variety of materials, including but not limited to plastic, metal, glass, rubber, and ceramic, or a combination thereof. In one embodiment the housing 41 includes removable portions (not shown) that may be interchanged with other removable portions of different color, or containing different logos, pictures, or symbols.

The display 30 of exemplary display device 40 may be any of a variety of displays, including a bi-stable display, as described herein. In other embodiments, the display 30 includes a flat-panel display, such as plasma, EL, OLED, STN LCD, or TFT LCD as described above, or a non-flat-panel display, such as a CRT or other tube device, as is well known to those of skill in the art. However, for purposes of describing the present embodiment, the display 30 includes an interferometric modulator display, as described herein.

The components of one embodiment of exemplary display device 40 are schematically illustrated in FIG. 6B. The illustrated exemplary display device 40 includes a housing 41 and can include additional components at least partially enclosed therein. For example, in one embodiment, the exemplary display device 40 includes a network interface 27 that includes an antenna 43 which is coupled to a transceiver 47. The transceiver 47 is connected to a processor 21, which is connected to conditioning hardware 52. The conditioning hardware 52 may be configured to condition a signal (e.g., filter a signal). The conditioning hardware 52 is connected to a speaker 45 and a microphone 46. The processor 21 is also connected to an input device 48 and a driver controller 29. The driver controller 29 is coupled to a frame buffer 28, and to an array driver 22, which in turn is coupled to a display array 30. A power supply 50 provides power to all components as required by the particular exemplary display device 40 design.

The network interface 27 includes the antenna 43 and the transceiver 47 so that the exemplary display device 40 can communicate with one ore more devices over a network. In one embodiment the network interface 27 may also have some processing capabilities to relieve requirements of the processor 21. The antenna 43 is any antenna known to those of skill in the art for transmitting and receiving signals. In one embodiment, the antenna transmits and receives RF signals according to the IEEE 802.11 standard, including IEEE 802.11(a), (b), or (g). In another embodiment, the antenna transmits and receives RF signals according to the BLUETOOTH standard. In the case of a cellular telephone, the antenna is designed to receive CDMA, GSM, AMPS or other known signals that are used to communicate within a wireless cell phone network. The transceiver 47 pre-processes the signals received from the antenna 43 so that they may be received by and further manipulated by the processor 21. The transceiver 47 also processes signals received from the processor 21 so that they may be transmitted from the exemplary display device 40 via the antenna 43.

In an alternative embodiment, the transceiver 47 can be replaced by a receiver. In yet another alternative embodiment, network interface 27 can be replaced by an image source, which can store or generate image data to be sent to the processor 21. For example, the image source can be a memory device such as a digital video disc (DVD) or a hard-disc drive that contains image data, or a software module that generates image data.

The processor 21 generally controls the overall operation of the exemplary display device 40. The processor 21 receives data, such as compressed image data from the network interface 27 or an image source, and processes the data into raw image data or into a format that is readily processed into raw image data. The processor 21 then sends the processed data to the driver controller 29 or to the frame buffer 28 for storage. Raw data typically refers to the information that identifies the image characteristics at each location within an image. For example, such image characteristics can include color, saturation, and gray-scale level.

In one embodiment, the processor 21 includes a microcontroller, CPU, or logic unit to control operation of the exemplary display device 40. The conditioning hardware 52 generally includes amplifiers and filters for transmitting signals to the speaker 45, and for receiving signals from the microphone 46. The conditioning hardware 52 may be discrete components within the exemplary display device 40, or may be incorporated within the processor 21 or other components.

The driver controller 29 takes the raw image data generated by the processor 21 either directly from the processor 21 or from the frame buffer 28 and reformats the raw image data appropriately for high speed transmission to the array driver 22. Specifically, the driver controller 29 reformats the raw image data into a data flow having a raster-like format, such that it has a time order suitable for scanning across the display array 30. Then the driver controller 29 sends the formatted information to the array driver 22. Although a driver controller 29, such as a LCD controller, is often associated with the system processor 21 as a stand-alone Integrated Circuit (IC), such controllers may be implemented in many ways. They may be embedded in the processor 21 as hardware, embedded in the processor 21 as software, or fully integrated in hardware with the array driver 22.

The driver controller 29 takes the raw image data generated by the processor 21 either directly from the processor 21 or from the frame buffer 28 and reformats the raw image data appropriately for high speed transmission to the array driver 22. Specifically, the driver controller 29 reformats the raw image data into a data flow having a raster-like format, such that it has a time order suitable for scanning across the display array 30. Then the driver controller 29 sends the formatted information to the array driver 22. Although a driver controller 29, such as a LCD controller, is often associated with the system processor 21 as a stand-alone Integrated Circuit (IC), such controllers may be implemented in many ways. They may be embedded in the processor 21 as hardware, embedded in the processor 21 as software, or fully integrated in hardware with the array driver 22.

In one embodiment, the driver controller 29, array driver 22, and display array 30 are appropriate for any of the types of displays described herein. For example, in one embodiment, driver controller 29 is a conventional display controller or a bi-stable display controller (e.g., an interferometric modulator controller). In another embodiment, array driver 22 is a conventional driver or a bi-stable display driver (e.g., an interferometric modulator display). In one embodiment, a driver controller 29 is integrated with the array driver 22. Such an embodiment is common in highly integrated systems such as cellular phones, watches, and other small area displays. In yet another embodiment, the display array 30 is a typical display array or a bi-stable display array (e.g., a display including an array of interferometric modulators).

The input device 48 allows a user to control the operation of the exemplary display device 40. In one embodiment, the input device 48 includes a keypad, such as a QWERTY keyboard or a telephone keypad, a button, a switch, a touch-sensitive screen, a pressure- or heat-sensitive membrane. In one embodiment, the microphone 46 is an input device for the exemplary display device 40. When the microphone 46 is used to input data to the device, voice commands may be provided by a user for controlling operations of the exemplary display device 40.

The power supply 50 can include a variety of energy storage devices as are well known in the art. For example, in one embodiment, the power supply 50 is a rechargeable battery, such as a nickel-cadmium battery or a lithium ion battery. In another embodiment, the power supply 50 is a renewable energy source, a capacitor, or a solar cell, including a plastic solar cell, and solar-cell paint. In another embodiment, the power supply 50 is configured to receive power from a wall outlet.

In some implementations control programmability resides, as described above, in a driver controller which can be located in several places in the electronic display system. In some cases control programmability resides in the array driver 22. Those of skill in the art will recognize that the above-described optimization may be implemented in any number of hardware and/or software components and in various configurations.

Figure 7A:
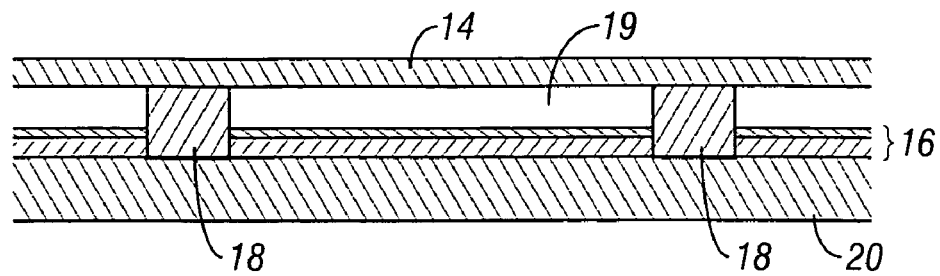
FIG. 7A is a cross section of the device of FIG. 1.
Figure 7B:
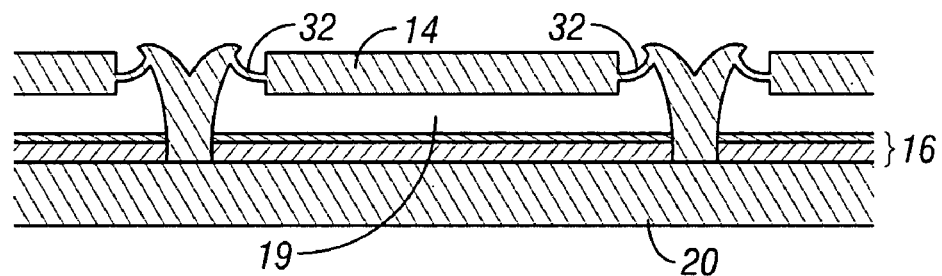
FIG. 7B is a cross section of an alternative embodiment of an interferometric modulator.
Figure 7C:
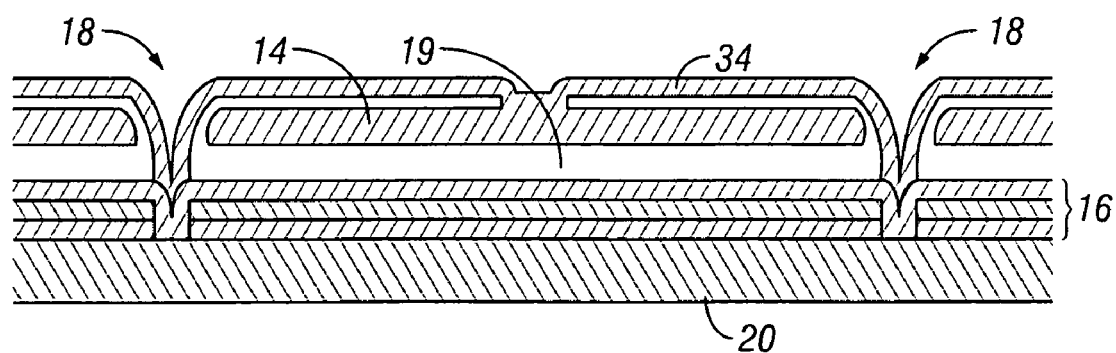
FIG. 7C is a cross section of another alternative embodiment of an interferometric modulator.

The details of the structure of interferometric modulators that operate in accordance with the principles set forth above may vary widely. For example, FIGS. 7A-7E illustrate five different embodiments of the movable reflective layer 14 and its supporting structures. FIG. 7A is a cross section of the embodiment of FIG. 1, where a strip of metal material 14 is deposited on orthogonally extending supports 18. In FIG. 7B, the moveable reflective layer 14 is attached to supports at the corners only, on tethers 32. In FIG. 7C, the moveable reflective layer 14 is suspended from a deformable layer 34, which may comprise a flexible metal. The deformable layer 34 connects, directly or indirectly, to the substrate 20 around the perimeter of the deformable layer 34. These connections are herein referred to as support structures, which can take the form of isolated posts and/or elongated rails extending the length of the array. With the latter, posts within each pixel cavity can serve to stiffen the flexible membrane which either is or suspends the movable reflective layer 14. The embodiment illustrated in FIG. 7D has support post plugs 42 upon which the deformable layer 34 rests. The movable reflective layer 14 remains suspended over the cavity, as in FIGS. 7A-7C, but the deformable layer 34 does not form the support posts by filling holes between the deformable layer 34 and the optical stack 16. Rather, the support structures include posts formed of a planarization material, which is used to form support post plugs 42. The embodiment illustrated in FIG. 7E is based on the embodiment shown in FIG. 7D, but may also be adapted to work with any of the embodiments illustrated in FIGS. 7A-7C as well as additional embodiments not shown. In the embodiment shown in FIG. 7E, an extra layer of metal or other conductive material has been used to form a bus structure 44. This allows signal routing along the back of the interferometric modulators, eliminating a number of electrodes that may otherwise have had to be formed on the substrate 20.

In embodiments such as those shown in FIG. 7, the interferometric modulators function as direct-view devices, in which images are viewed from the front side of the transparent substrate 20, the side opposite to that upon which the modulator is arranged. In these embodiments, the reflective layer 14 optically shields the portions of the interferometric modulator on the side of the reflective layer opposite the substrate 20, including the deformable layer 34. This allows the shielded areas to be configured and operated upon without negatively affecting the image quality. Such shielding allows the bus structure 44 in FIG. 7E, which provides the ability to separate the optical properties of the modulator from the electromechanical properties of the modulator, such as addressing and the movements that result from that addressing. This separable modulator architecture allows the structural design and materials used for the electromechanical aspects and the optical aspects of the modulator to be selected and to function independently of each other. Moreover, the embodiments shown in FIGS. 7C-7E have additional benefits deriving from the decoupling of the optical properties of the reflective layer 14 from its mechanical properties, which are carried out by the deformable layer 34. This allows the structural design and materials used for the reflective layer 14 to be optimized with respect to the optical properties, and the structural design and materials used for the deformable layer 34 to be optimized with respect to desired mechanical properties.

Figure 7D:
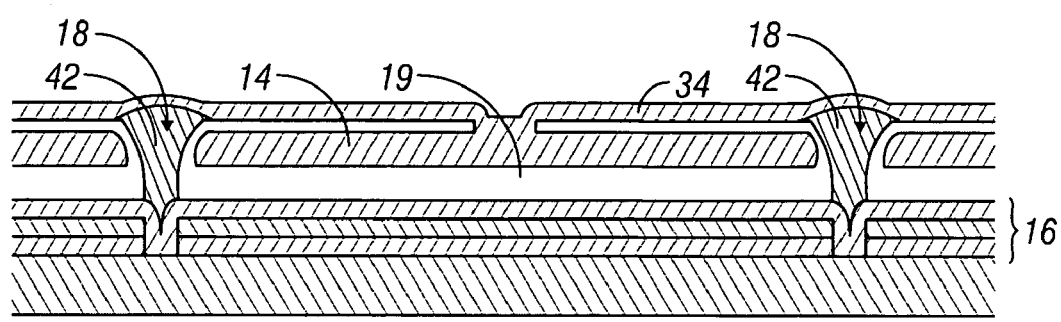
FIG. 7D is a cross section of yet another alternative embodiment of an interferometric modulator.
Figure 7E:
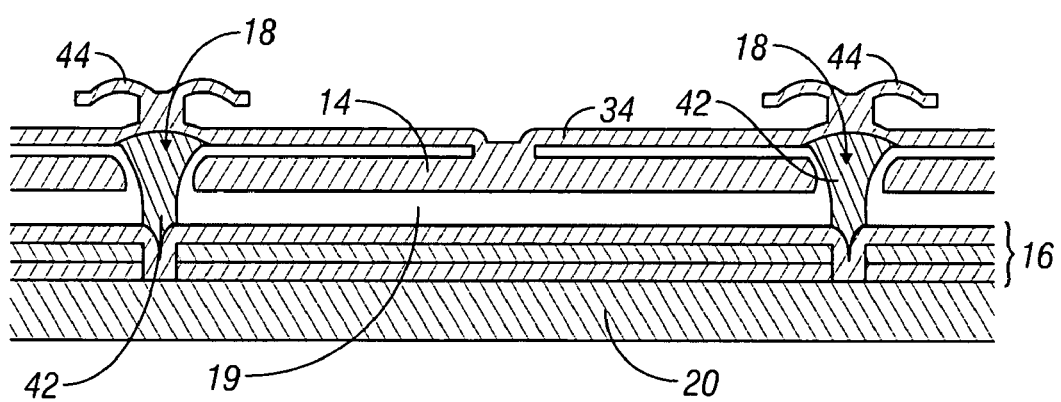
FIG. 7E is a cross section of an additional alternative embodiment of an interferometric modulator.

The embodiments shown in FIGS. 7C-7E can exhibit one or more problems related to clearance of the movable reflective layer 14, the deformable layer 34 and the support structures, such as rails or the illustrated posts 18. Without being limited by theory, it is believed that clearance problems may be a result of an equilibrium position that the device settles into upon release of sacrificial material to form the cavity 19. The relative positions of the movable reflective layer 14, the posts 18 and the deformable layer 34 can change upon release of the sacrificial layer due to various tensile and/or compressive stresses that are created in the various structures during fabrication. Clearance problems can also or alternatively result during actuation and de-actuation of the movable reflective layer 14. The corner portions of the movable reflective layer 14, where the deformable layer 34, the posts 18 and the movable reflective layer 14 overlap, can be susceptible to clearance problems. Embodiments of a spacer formed on a sidewall of the movable reflective layer 14 provide increased clearance between the reflective layer 14, the posts 18 and the deformable layer 34. Both the static clearance before and after release of the sacrificial layer and the dynamic clearance during actuation and deactuation of the device can be increased.

Another problem associated with the performance of MEMS devices involves the structural integrity of the deformable layer 34 when formed over various other layers that may have been patterned and etched to have non-smooth or irregular contours. Metal layers, which the deformable layer may include, may suffer from excessive stresses during formation when applied over steep or reentrant steps such as may develop during a wet etch for example. In addition to being adversely affected by sharp steps, metal layers may have problems in filling in reentrant regions that may also form during patterning of lower layers (e.g., the metal layer used to form the reflective layer 14). One way to avoid these sharp steps and/or reentrant profiles is to employ etching techniques to make smooth, less sharp, tapered openings for deposition of the posts 18 and/or the deformable layer 34.

FIG. 7C shows an integrated post 18 and deformable layer 34 with a smooth gradual corner that may be formed at the reflective layer 14 corners using, e.g., special lithography and expensive dry etch techniques. Embodiments using a spacer formed on the sidewall of the movable reflective layer 14 allow for formation of a deformable layer 34 that exhibits a smooth continuous structure, even over structures with reentrant profiles and/or sharp steps that result from wet etching or other methods. This continuous structure results in a device that may have a longer lifetime and better performance than a device with a deformable layer that may suffer from discontinuous coverage of lower layers due to sharp steps and/or reentrant profiles.

Figure 8A:
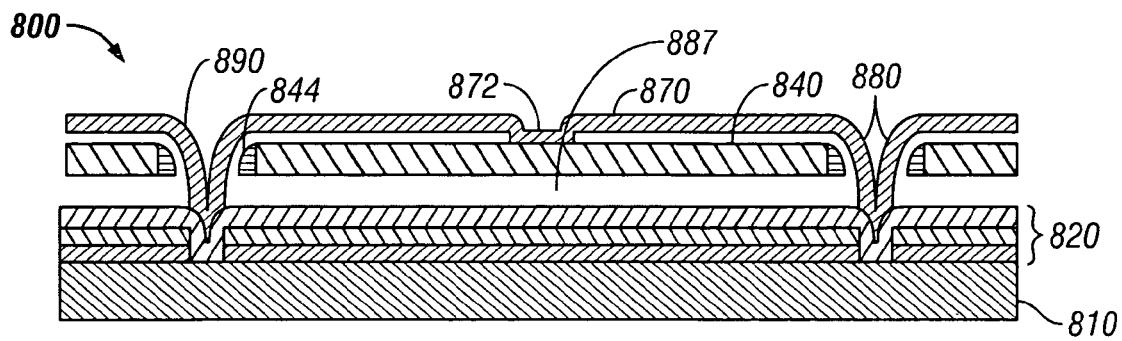
FIG. 8A schematically illustrates in cross section an embodiment of the disclosed MEMS device.

FIG. 8A illustrates a cross section of an embodiment of a microelectromechanical systems device (MEMS) 800, which is similar to the interferometric modulator illustrated in FIG. 7C where a movable layer also serves as support material. As will be apparent to those skilled in the art, certain of the teachings provided herein are also applicable to other MEMS devices, for example, the interferometric modulators illustrated in FIG. 7D and FIG. 7E. The MEMS device 800 disclosed herein comprises a substrate 810, a movable conductor 840 including one or more sidewall spacers 844, a deformable layer 870, and a plurality of support posts 880. In the illustrated embodiment, a connector 872 secures the movable conductor 840 to the deformable layer 870 and suspends the movable conductor 840 within a cavity 887. The terms "mechanical layer", "flex layer", and "flexible membrane" may also be used to refer to the deformable layer 870. The support posts 880 are also referred to herein as "supports", "support structures" or "posts." Note that in some arrangements, the supports comprise partially or fully enclosing walls rather than isolated columns. Some embodiments may use rivets to support the deformable layer. Rivets overlie the deformable layer and are formed in depressions defined by the deformable layer. Rivet formation will be discussed below in reference to FIGS. 11A to 11C. In embodiments in which the MEMS device 800 is an interferometric modulator, the device further comprises an optical stack 820 formed on the substrate 810 as described above, the substrate 810 is preferable transparent, and the movable conductor 840 is a mirror. The descriptions provided herein of the MEMS devices and methods for fabricating interferometric modulators are also applicable to other types of MEMS devices, as would be understood by those skilled in the art.

The sidewall spacer 844, in the embodiment shown in FIG. 8A, is shown as remaining attached to the movable conductor 840 after the release etch that forms the cavity 887. In other embodiments, the sidewall spacer 844 is removed. By removing the sidewall spacer 844, the clearances between the movable conductor 840, the posts 880 and the deformable layer 870 can be increased as discussed above.

Referring again to FIG. 8A, the deformable layer 870 and at least one of the posts 880 are integrated. In some embodiments, the deformable layer 870 and all of the posts 880 are integrated. As discussed in greater detail below, in some embodiments, the integrated deformable layer 870 and post (s) 880 are formed in the same deposition step(s). The illustrated embodiment comprises a transition 890 between the integrated deformable layer 870 and the post 880 comprising substantially an arcuate or convex (as viewed from above) surface. In some embodiments, where the support structures are formed separately from the deformable layer, the deformable layer can be formed after formation of the posts such that the posts underlie the deformable layer. An embodiment of a method of fabricating posts underlying the deformable layer is discussed below with reference to FIGS. 10A to 10G. In some embodiments, the deformable layer may be formed before the formation of overlying rivets, which serve to reinforce support. An embodiment of a method of fabricating rivets overlying the deformable layer 870 is discussed below with reference to FIGS. 11A to 11C.

Figure 8B:
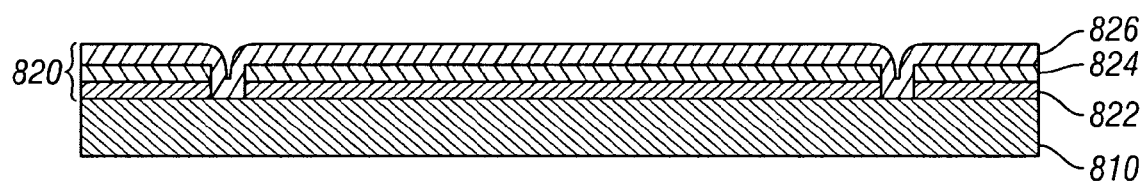
FIGS. 8B through 8I illustrate intermediate stages in an embodiment of the fabrication thereof, where a movable layer also serves as support material.
Figure 8C:
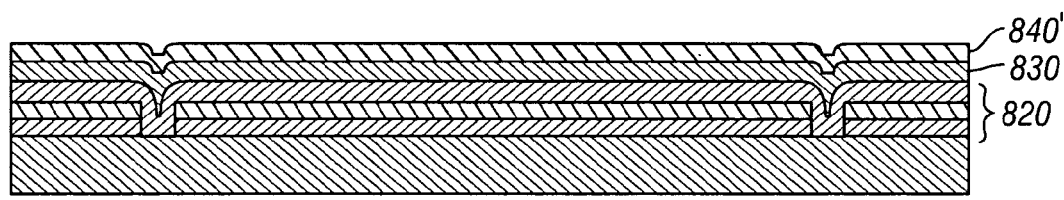
Figure 8D:
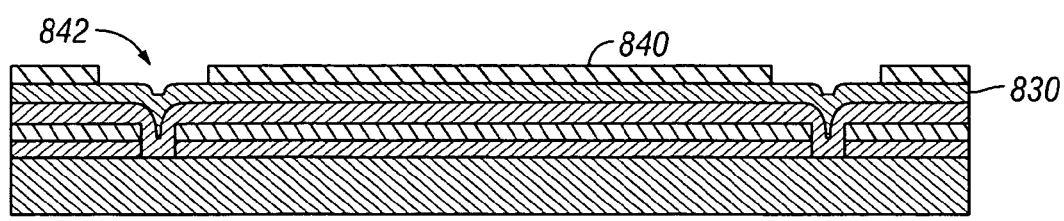
Figure 8E:
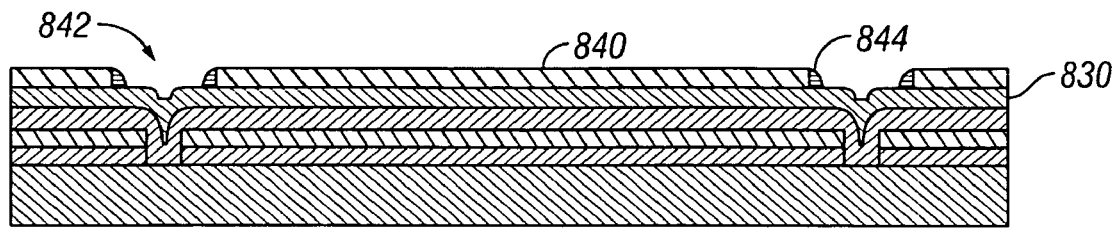
Figure 8F:
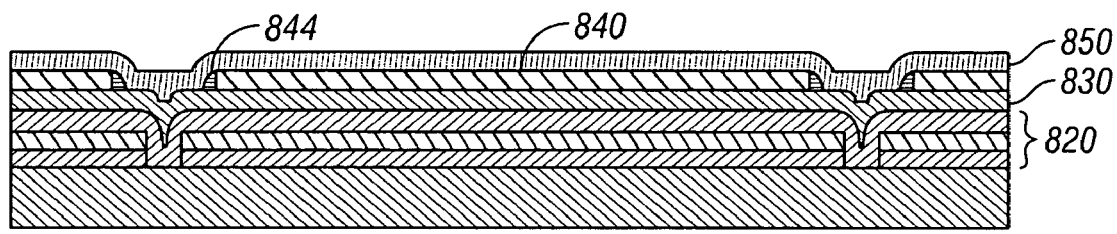
Figure 8G:
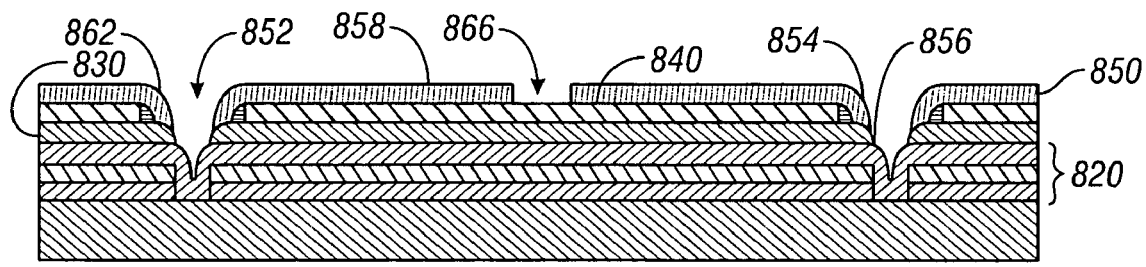
Figure 8H:
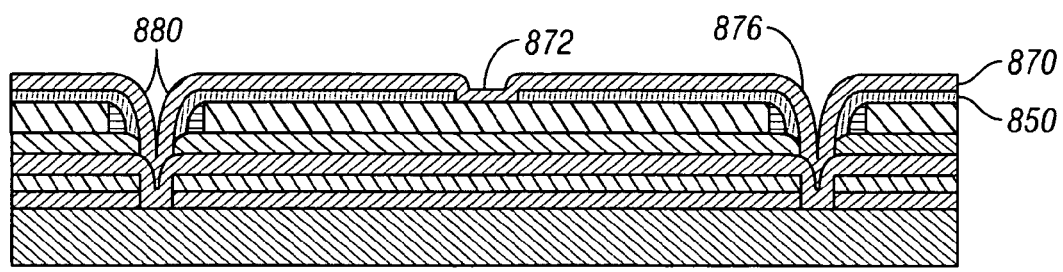
Figure 8I:
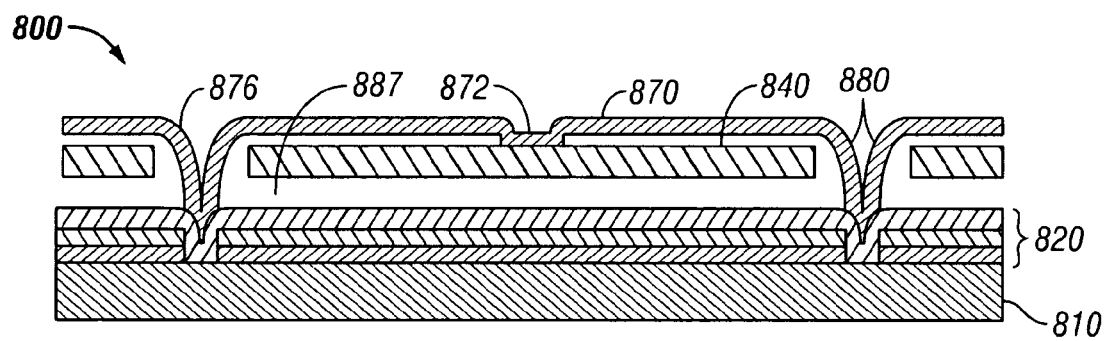
Figure 9:
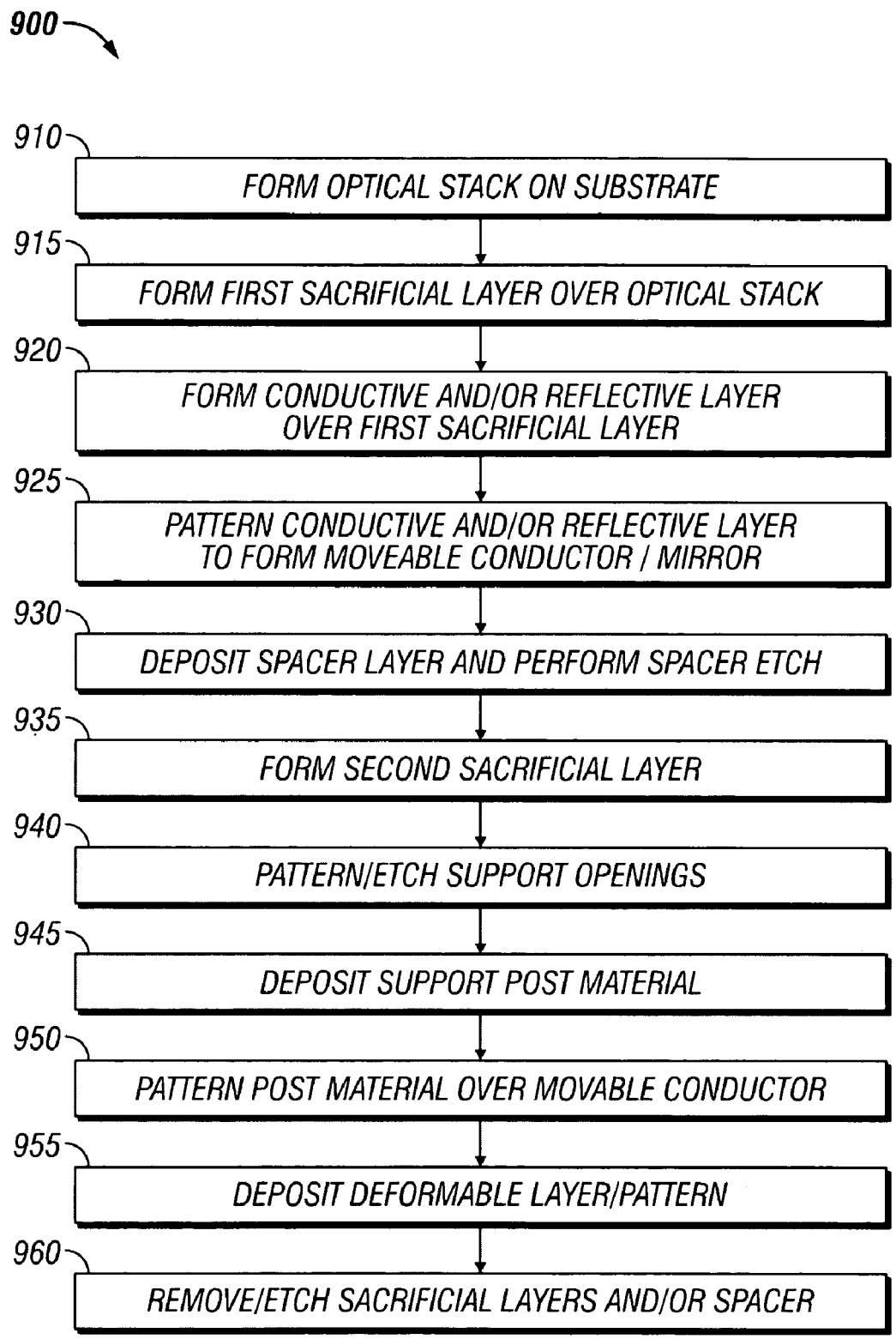
FIG. 9 is a flowchart of an embodiment of a method for manufacturing the MEMS device illustrated in FIG. 8A.

FIG. 9 is a flowchart illustrating a process 900 for fabricating an embodiment of the MEMS device 800 in which the MEMS device is an optical modulator, for example, as illustrated in FIG. 8A. This description makes reference to certain intermediate structures illustrated in FIG. 8B through FIG. 8I. Those skilled in the art will understand that, depending on the particular materials selected, some embodiments of the method will include additional steps, for example, forming etch stops and/or hard masks. Those skilled in the art will also understand that in some embodiments, some steps are performed in different orders and/or combined.

In step 910, an optical stack 820 is formed on the substrate 810 as described above. In some embodiments, the optical stack 820 comprises an electrode layer 822, a partially reflective layer 824, and a dielectric layer 826, as illustrated in FIG. 8B. In the illustrated embodiment, the electrode layer 822 and partially reflective layer 824 are formed on the substrate 820, patterned, and the dielectric layer 826 formed thereon.

In step 915, a first sacrificial layer 830 is formed over the optical stack 820, as illustrated in FIG. 8C. In the illustrated embodiment, the first sacrificial layer 830 is from about 300 Å to about 10,000 Å thick, more preferably, from about 1000 Å to about 3000 Å thick. In some embodiments, the thickness of the first sacrificial layer 830 is substantially uniform. The first sacrificial layer 830 comprises a first sacrificial material. Suitable sacrificial materials are known in the art, for example, inorganic sacrificial materials and organic sacrificial materials. Examples of suitable inorganic sacrificial materials include silicon, titanium, zirconium, hafnium, vanadium, tantalum, niobium, molybdenum, and tungsten. Examples of suitable organic sacrificial materials include polymeric materials known in the art, including photoreactive polymers, photoresists, and polymers such as polymethylmethacrylate (PMMA). The first sacrificial layer 830 is formed using methods known in the art, which will depend on the particular sacrificial material selected, and include spinning on, physical vapor deposition (PVD), sputtering, chemical vapor deposition (CVD), atomic layer deposition (ALD), and variants thereof. In some preferred embodiments, the first sacrificial material, for example, molybdenum is etchable using $XeF_2$. In some embodiments, formation of the first sacrificial layer may include one or more patterning steps followed by deposition of one or more additional sacrificial layers, thereby forming a multiple sacrificial layer. This may be done in order to form different thicknesses of sacrificial layers underlying the movable conductor 840 in order to provide cavities of different depths (e.g., for fabricating interferometric modulators providing different colors).

In step 920, a conductive layer 840' is formed over the first sacrificial layer 830, as illustrated in FIG. 8C. In embodiments in which the MEMS device is an interferometric modulator, the conductive layer 840' is also referred to as a "reflective layer" or a "mirror layer." In these embodiments, the conductive layer comprises a specular or reflective surface in the visible spectrum, for example, aluminum, titanium, chromium, silver, or gold and the undersurface reflects greater than about 85% of visible light. The resulting structure is illustrated in FIG. 8C. Methods for forming the conductive layer 840' are known in the art, for example, PVD, CVD, ALD, and variants thereof. In some embodiments, the conductive layer 840' is from about 0.2 µm to about 1.5 µm thick, preferably, about 1 µm thick for greater mechanical stability.

In some embodiments, the conductive layer 840' is a composite comprising a plurality of sub-layers. Some embodiments of composite conductive layers 840' exhibit improved properties, for example, reflectivity, rigidity, weight, ease of manufacture, and the like. Although layer 840- is referred to as the conductive layer in the discussion above, other embodiments may comprise a movable-element 840 that is non-conductive, where the deformable layer 870 may comprise a conductive material that serves as a second electrode to be attracted to the lower electrode layer 822 during actuation. In these embodiments, non-metal materials may be used to form the movable element 840.

In step 925, the conductive layer 840' is patterned and etched to form a movable conductor 840 as illustrated in FIG. 8D. The patterning and etching forms an opening 842 adjacent to the movable conductor 840. As discussed above, in the illustrated embodiment, the movable conductor 840 is a movable mirror. In some embodiments, after the conductive layer 840' is patterned to form the movable conductor 840, the movable conductor 840 itself acts as a hard mask for patterning the first sacrificial layer 830. In some embodiments, the movable conductor 840 comprises a width in a range from about 50 μm to about 75 μm or larger. A variety of methods can be used to perform the patterning and etching of the conductive layer 840', as well as other etches performed in the process 900. The etches used may be either a dry etch (e.g., reactive ion etch (RIE)) or a wet etch, and may be isotropic or anisotropic. However, isotropic wet etching may cost less than other types of etching and the normally undesired artifacts, such as unevenness or reentrant profiles, can be tolerated when using the sidewall spacer 844 as discussed below. Wet etches including but not limited to PAD etches, BHF, KOH, and phosphoric acid may be utilized in the processes described herein. The patterning may comprise the deposition of a photoresist (PR) layer (either positive or negative photoresist), which is then used to form a mask. Alternately, a hard mask can be utilized. In some embodiments, the hard mask may comprise metal or $SiN_x$, but it will be understood that the composition of the hard mask may depend on the underlying materials to be etched and the selectivity of the etch to be used. The hard mask is typically patterned using a PR layer, which is then removed, and the hard mask is used as a mask to etch an underlying layer. The use of a hard mask may be particularly advantageous when a wet etch is being used, or whenever processing through a mask under conditions that a PR mask cannot handle (such as at high temperatures, or when using an oxygen-based etch). Alternate methods of removing layers may also be utilized, such as an ashing etch or lift-off processes.

Figure 10A:
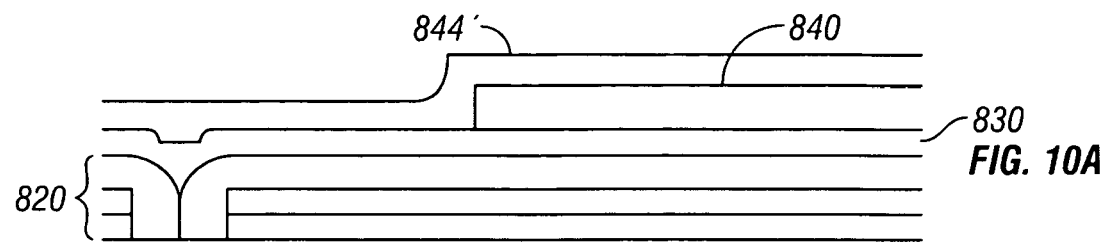
FIGS. 10A through 10G schematically illustrate in greater detail an embodiment of a method for fabricating a MEMS device, in which separate support material is deposited prior to the movable layer(s).
Figure 10B:
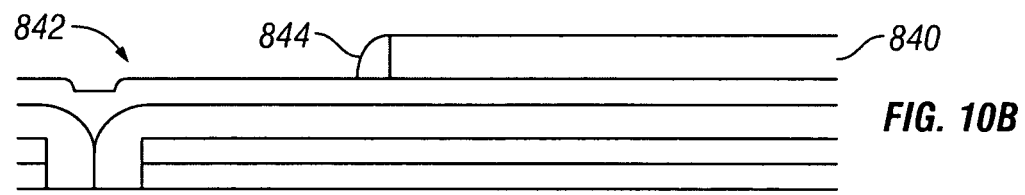

FIG. 8E shows the spacer 844 formed on the sidewalls of the patterned conductor 840. FIGS. 10A and 10B schematically illustrate an embodiment of a method for fabricating the sidewall spacer 844 in a MEMS device. FIGS. 10A and 10B are an expanded view of the region of the interferometric modulator 800 in the area of the opening 842. After formation of the opening 842, a conformal blanket layer 844' of spacer material is deposited over the opening 842 and the movable conductor 840 at step 930. The blanket layer 844' of spacer material may be deposited by chemical vapor deposition (CVD). The spacer material may comprise a sacrificial material or a non-sacrificial material. In the case of a sacrificial spacer material, the conformal layer 844' may comprise a-Si, or $SiN_x$. An anisotropic spacer etch is then performed at step 930 resulting in formation of the sidewall spacer 844 shown in FIGS. 8E and 10B. As is known in the art of semiconductor fabrication, the spacer etch comprises selectively removing portions of the blanket layer 844' of spacer material from horizontal surfaces exploiting the anisotropic nature of reactive ion etching. Selectively removing portions of the blanket layer may also comprise selectively etching the spacer material of the blanket layer 844' relative to material of the first sacrificial layer 830. The spacer etch comprises an anisotropic dry etch. The remaining sidewall spacer 844 preferably fills in any reentrant region formed by the wet etch of the conductive layer 840' when forming the movable conductor 840. Generally, the thickness of the conformal spacer layer 844' determines the width of the spacer 844, where the width is measured parallel to the substrate 810. The width of the spacer 844 typically measures from about 0.1 μm to about 0.4 μm. The thickness of the spacer layer 844', and the duration/energy of the etch at step 830 are designed to result in a spacer 844 of the desired width. The spacer 844 preferably comprises a substantially convex top surface away from the substrate 810. The top surface of the spacer 844 may comprise a substantially convex up transition from the top of the movable conductor 840 to the first sacrificial layer.

Figure 10C:
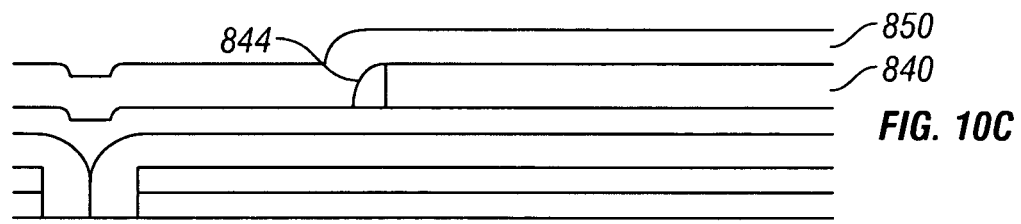

After formation of the sidewall spacer 844, a second sacrificial layer 850 is formed, at step 935, over the movable conductor 840, the sidewall spacer 844, and the portions of the first sacrificial layer 830 exposed in the opening 842 in the first sacrificial layer to provide the structure illustrated in FIGS. 8F and 10C. In the illustrated embodiment, the second sacrificial layer 850 comprises a substantially convex top surface away from the substrate 810, in the area of the sidewall spacer 844, that substantially conforms to the contour of the sidewall spacer 844. In the illustrated embodiment, the second sacrificial layer 850 is conformal over the movable conductor 840, the spacer 844 and the opening 842. In some embodiments, the second sacrificial layer 850 has a thickness of about 0.2 μm to 0.4 μm. The second sacrificial layer 850 comprises a second sacrificial material. In some embodiments, the second sacrificial material is different from the first sacrificial material, but is preferably removable by the same release etch that removes the first sacrificial layer 830. In some embodiments, the second sacrificial material comprises a self-planarizing material, for example, a resist, a photoresist (or other polymer), or an inorganic planarization material such as spin-on glass (SaG) or spin-on dielectric (SOD). As used herein, the term "self-planarizing" is used to refer to a material that is relatively planar as deposited, as opposed to conformal. The second sacrificial layer 850 is formed using methods known in the art, which depend on the selected sacrificial material. In some embodiments, the second sacrificial layer 850 is formed by spin coating. The thickness of the second sacrificial layer 850 will depend on the particular application.

In step 940, the second sacrificial layer 850 and the first sacrificial layer 830 are patterned to form one or more first openings 852 in the second sacrificial layer 850 and the first sacrificial layer 830 using methods known in the art to provide the structure illustrated in FIG. 8G. The first opening 852 is substantially aligned with and/or in the same location as the opening 842 in conductive layer 840' (illustrated in FIG. 8D). In the illustrated embodiment, the walls 854 of the first opening 852 are lined with the second sacrificial layer material and the first sacrificial layer material. In the illustrated embodiment, the first opening 852 is narrower than the opening 842, such that the optical stack 820 forms least a portion of the bottom 856 of the first opening 852. A step or ledge 862 is shown in FIG. 8G forming a transition between the walls 854 of first opening 852 and a top surface 858 of the second sacrificial layer. Referring to the detailed schematic shown in FIG. 10D (which differs from the embodiment of FIG. 8 only in employing a separate support material in subsequent steps), the step or ledge comprises a step 846, a transitional top surface 860 of the second sacrificial layer 850, and walls 854 defining a second step. In the illustrated embodiment, the second sacrificial material and the first sacrificial layer material substantially surround the movable conductor 840 and the sidewall spacer 844. Referring again to FIG. 8G, the illustrated embodiment also comprises a second opening 866 in the second sacrificial layer 850. In some embodiments, the second opening 866 is substantially centered over the movable conductor 840 or mirror. In some embodiments, multiple second openings 866 may be formed in the second sacrificial layer 850. As discussed in greater detail below, in some embodiments, a connector (872 in FIG. 8A) is formed through the second opening 866.

The walls 854 and/or step or ledge 862 formed in step 940 are conducive to formation of a relatively uniform deformable layer/post structure (see 870 and 880 in FIG. 8A) over the second sacrificial layer 850. The upper portion of the step or ledge 862 substantially conforms to the convex up transition of the sidewall spacer 844. Surface topologies conducive to the formation of such layers are known in the art.

In the embodiment shown in FIG. 8, optional steps 945 and 950 are omitted and the process 900 continues at step 955. In step 955, the deformable layer 870 is formed over the second sacrificial layer 850 using methods known in the art to provide the structure illustrated in FIG. 8H. In the illustrated embodiment, the connector 872 and posts 880 are integrally formed with the deformable layer 870. In some embodiments, the deformable layer 870 is conformal. For example, in the illustrated embodiment, the transition 876 between the deformable layer 870 and posts 880 comprises one or more steps and/or ledges, formed over the step or ledge 862 in the second sacrificial layer 850. In a configuration similar to the detailed schematic shown in FIG. 10, the transition 876 comprises a first step (e.g., over the step 846 of FIG. 10D), a transitional top surface (e.g., over the transitional top surface 860 of FIG. 10D), a second step (e.g., conforming to the wall 854 of FIG. 10D), and a top surface. In other embodiments, discussed below in reference to FIGS. 10D to 10G and 11A to 11C, posts 880 and/or rivets 890 are formed separately from the deformable layer 870. The deformable layer 870 may be patterned and etched in some embodiments.

In step 960, the first and second sacrificial layers 830 and 850 are substantially completely removed and/or etched away. Those skilled in the art will understand that the particular etching conditions depend on the identity of the second sacrificial material. In some embodiments, the second sacrificial material is selectively removed relative to other structures in the device, for example, the structures illustrated in FIG. 8A. In some embodiments, the second sacrificial material is removed by ashing, for example, where the second sacrificial material is a resist, a photoresist, or a planarization material. In other embodiments, the second sacrificial material is etched away by another method known in the art, for example, by reactive ion etching and/or using a gas phase etchant (e.g., XeF$_2$). In some embodiments, the first sacrificial material is removed in the same step. In other embodiments, the first sacrificial material is removed in a different step. The structure resulting from removing both the first and second sacrificial materials is illustrated in FIG. 8A.

In the embodiment shown in FIG. 8I, the sidewall spacer 844 is removed and/or etched away along with the second sacrificial layer 850 and/or the first sacrificial layer 830. Those skilled in the art will understand that the particular etching conditions depend on the identity of the spacer material. By removing the spacer material, the clearance is increased between the sidewall of the movable conductor 840 and the transition 876 between the deformable layer 870 and posts 880. This increased clearance results from the transition 876 conforming to the contour of the sidewall spacer 844 instead of conforming to the steep sidewall (or even a reentrant sidewall) of the movable conductor 840.

While the embodiment of the process 900 discussed in reference to FIG. 8 resulted in an integrated post and deformable layer formed from the same deposition, other embodiments result in support structures and deformable layers formed at different times. The resulting structure of one of these embodiments, at various points in the process 900, is depicted in FIGS. 10A to 10G. The process depicted in FIG. 10 forms post structures 880 that underlie the deformable layer 870. In this embodiment, the process 900 can progress as discussed above in reference to FIGS. 8 and 10 up to and through step 935 with the formation of the second sacrificial layer 850 over the opening 842, the sidewall spacer 844 and the movable conductor 840, as depicted in FIG. 10C.

Figure 10D:
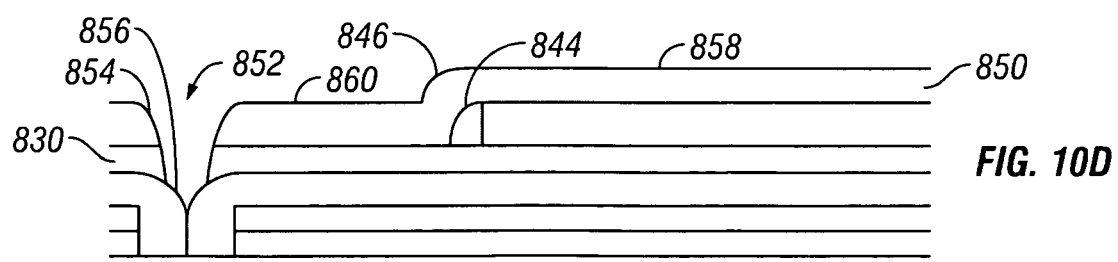

In step 940, the second sacrificial layer 850 and the first sacrificial layer are patterned to form one or more first post openings 852 in the second sacrificial layer 850 and the first sacrificial layer 830 using methods known in the art to provide the structure illustrated in FIG. 10D. The first opening 852 is formed within the opening 842 (FIG. 10B) formed in the conductive layer 840' when patterning the movable conductor 840. In the illustrated embodiment, the width of the first opening is smaller than the width of the opening 842 in the conductive layer 840'. In some embodiments the distance between the sidewall of the movable conductor 840 and the nearest wall 854 is in the range of about 2 μm to about 5 μm, preferably about 3 μm. In these embodiments, the width of the spacer 844 is typically in the range of about 0.1 μm to about 0.4 μm at the widest portion of the spacer. In the illustrated embodiment, the walls 854 of the first opening 852 are defined by the second sacrificial layer material and the first sacrificial layer material. In the illustrated embodiment, the optical stack 820 forms least a portion of the bottom 856 of the first opening 852. The second sacrificial layer 850 comprises a step 846 transitioning from the transitional top surface 860 to the top surface 858 of the second sacrificial layer 850 that is located over the movable conductor 840. The step 846 preferably comprises a convex up transition that conforms substantially to the contour of the spacer 844. As discussed above, the illustrated embodiment may also comprise a second or connector opening (see 866 of FIG. 8G) formed in the second sacrificial layer 850.

Figure 10E:
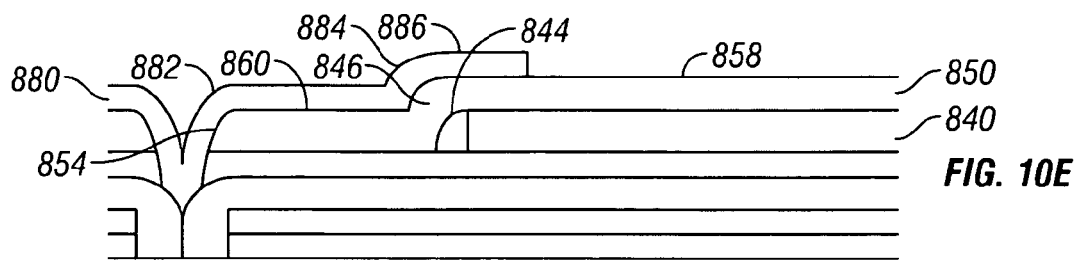

After the first opening 852 is formed, the process 900 continues at step 945 with deposition of a support post material layer and possible patterning of the post material at step 950 resulting in support posts 880 as depicted in FIG. 10E. In some embodiments, the support post material comprises a self-planarizing material such as a photoresist or other types of spin on materials. In some embodiments, the support post material comprises an inorganic material, such as a silicon oxide or a metal oxide. In some embodiments, the support post material layer is conformal. For example, in the illustrated embodiment, the support post 880 comprises a first step 882 between the optical stack 820 and the transitional top surface 860 of the second sacrificial layer 850. The support post 880 of this embodiment also comprises a second step 884 transitioning between the transitional top surface 860 and the top surface 858 of the second sacrificial layer 850. The first step 882 of the post 880 substantially conforms to the wall 854 of the first opening 852 and the second step 884 substantially conforms to the step 846 in the second sacrificial layer. In some embodiments, such as that illustrated in FIG. 10E, the post 880 comprises a wing 886 that extends over the second sacrificial layer 850 and extends beyond the sidewall spacer 844 and a portion of the movable conductor 840. Thus the oxide post 880 overlaps the corner of the movable conductor 840. In embodiments such as interferometric modulators, the wing 886 overlaps about 1 µm to about 2 µm of the moveable reflective layer. In any of these embodiments, the support post material is chosen such that a selective etch can remove the sacrificial materials of the sacrificial layers 830 and 850 selectively relative to the post material (and the electrode material).

Figure 10F:
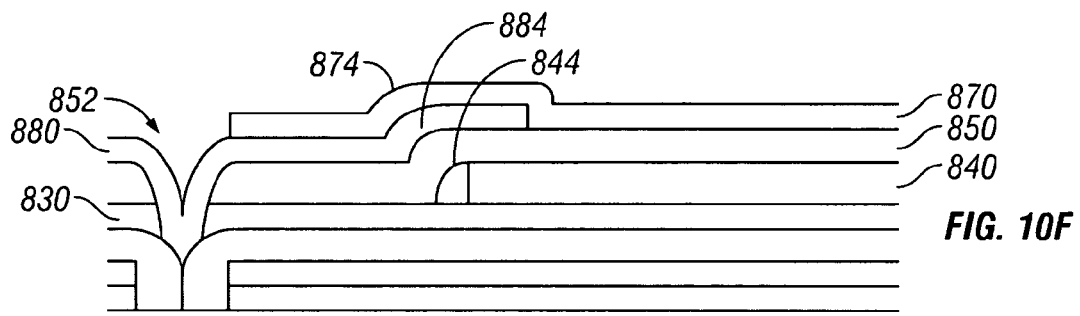

In step 955, the deformable layer 870 is formed over the second sacrificial layer 850 and the post 880 as shown in FIG. 10F. In the illustrated embodiment, the deformable layer 870 is conformal. The deformable layer 870 may be patterned and etched to remove it from the post region in the opening 852 formed in the first and second sacrificial layers as illustrated in FIG. 10F. In other embodiments, the deformable layer may remain covering substantially all of the post 880. In the illustrated embodiment, the deformable layer comprises a step 874 that conforms substantially to the convex up contour of the second step 884 of the post 880. This step is smoother due to the presence of the sidewall spacer 844 than it would be without.

In step 960, the first and second sacrificial layers 830 and 850 are substantially completely removed and/or etched away to form the cavity 887. Those skilled in the art will understand that the particular etching conditions depend on the identity of the second sacrificial material. In some embodiments, the second sacrificial material is selectively removed relative to other structures in the device. In some embodiments, the second sacrificial material is removed by ashing, for example, where the second sacrificial material is a resist, a photoresist, or a planarization material. In other embodiments, the second sacrificial material is etched away by another method known in the art, for example, by reactive ion etching and/or using a gas phase etchant (e.g., $XeF_2$). In some embodiments, the first sacrificial material is removed in the same step. In other embodiments, the first sacrificial material is removed in a different step.

Figure 10G:
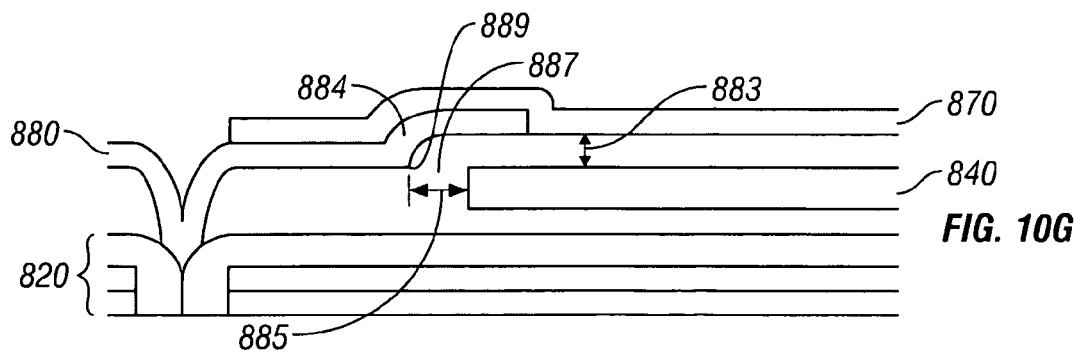

In some embodiments, the sidewall spacer 844 is removed and/or etched away along with the second sacrificial layer 850 and/or the first sacrificial layer 830. Those skilled in the art will understand that the particular etching conditions depend on the identity of the spacer material. The structure resulting from removing both the first and the second sacrificial materials and the spacer material is illustrated in FIG. 10G in a relaxed condition. By removing the spacer material, the clearance, in the relaxed condition, is increased between the sidewall of the movable conductor 840 and the underside transition in the second step 884 of the post in the illustrated embodiment. The underside transition of the second step 884 of the post 880 is determined by the contour of the removed spacer 844. The increased clearance depends, at least in part, on the width of the spacer 844. In the illustrated embodiment, the width of the spacer, and the increased clearance, can be in the range of about 0.1 µm to 0.4 µm. In an interferometric modulator in the relaxed condition, the clearance distance 883 between the top of the movable conductor 840 and the bottom of the ceiling of the cavity 887 (as determined by the post 880 and the deformable layer 870) can be in the range of about 0.2 µm to about 0.4 µm. This distance range would typically also represent the horizontal clearance between the sidewall of the movable reflective layer and the lower corner 889 of the transition of the underside of the ceiling of the cavity 887 if no spacer was present. However, the horizontal clearance distance 885 obtained with a removable sidewall spacer increases by the width of the spacer or about 0.1 µm to about 0.4 µm for a total of about 0.3 µm to about 0.8 µm. If the vertical clearance 883 from the movable conductor 840 to the deformable layer 870 is 0.2 to 0.4 µm, the added clearance by removal of the spacer corresponds to a percentage increase of about 25% to about 200%. This increased clearance can improve the performance and reliability of the interferometric modulator. Preferably the horizontal clearance 885 is greater than 25%, more preferably greater than 50% and is typically 50 to 200% greater than the vertical distance 883, in the relaxed condition. The clearances discussed above and illustrated in FIG. 10G are pre-release clearances prior to removal of the sacrificial layer(s) and/or spacer. Preferably the post-release clearances are the same or similar, however small changes in cavity shape and clearances can result upon removal of the sacrificial layers and/or spacer.

Figure 11A:
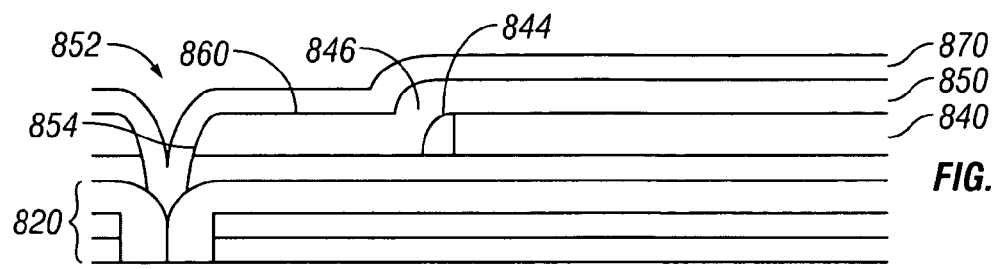
FIGS. 11A through 11C schematically illustrate another embodiment of a method for fabricating a MEMS device.
Figure 11B:
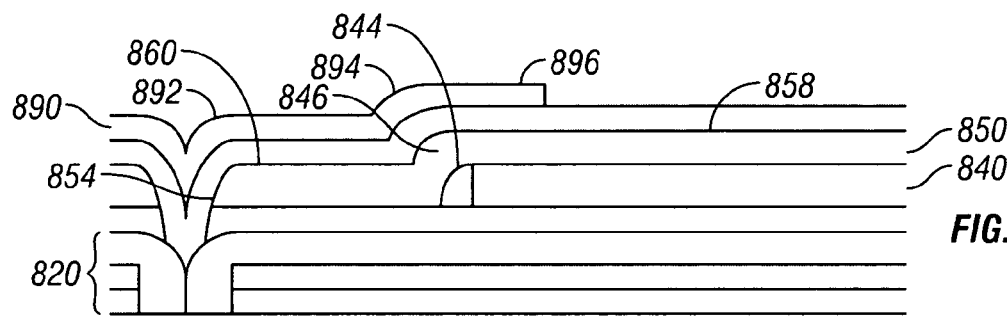
Figure 11C:
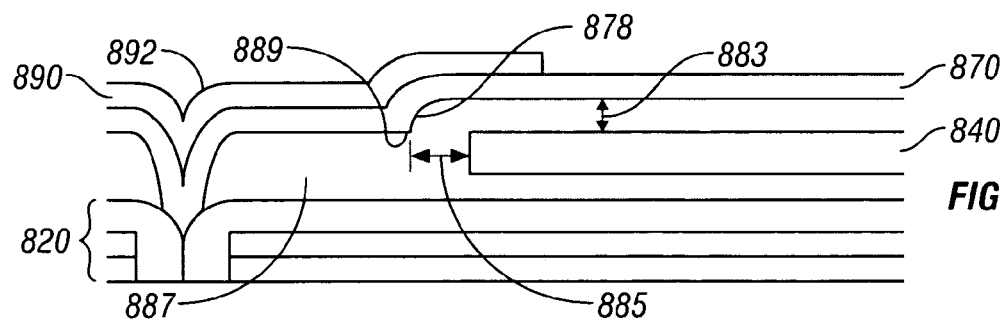

FIGS. 11A through 11C schematically illustrate another embodiment of a method for fabricating a MEMS device. The process depicted in FIG. 11 forms rivet structures that overlie the deformable layer 870. In this embodiment, the process 900 can progress as discussed above in reference to FIGS. 8 and 10 up to and through step 940 with the formation of the first opening 852 through the first and second sacrificial layers as depicted in FIG. 10O. In this embodiment, steps 945 and 950 are omitted from the process 900, and the process 900 continues at step 955.

In step 955, the deformable layer 870 is formed over the second sacrificial layer 850 and the first opening 852. In the illustrated embodiment, the deformable layer 870 is conformal. In the illustrated embodiment, the deformable layer comprises a first step that conforms substantially to the walls 854 of the opening 852, and a second step that conforms substantially to the convex up contour of the step 846 of the second sacrificial layer 850 as depicted in FIG. 11A.

Instead of forming support posts that underlie or are integrated with the deformable layer 870, this embodiment forms rivet structures that overlie the deformable layer 870 in the depressions of the deformable layer deposited in the openings 852 (this step not shown in FIG. 9). The process 900 continues with deposition of a support rivet material layer and preferably patterning of the rivet material, resulting in support rivets 890 as depicted in FIG. 11B. In some embodiments, the support rivet material comprises an oxide. In some embodiments, the support rivet material layer is conformal. For example, in the illustrated embodiment, the support rivet 890 comprises a first step 892 between the lowest point in the first opening 852 and the transitional top surface 860 of the second sacrificial layer 850. The support rivet 890 of this embodiment also comprises a second step 894 transitioning between the transitional top surface 860 and the top surface 858 of the second sacrificial layer 850. The first step 892 of the rivet 890 substantially conforms to the wall 854 of the first opening 852 and the second step 894 substantially conforms to the step 846 in the second sacrificial layer 850. In some embodiments, such as that illustrated in FIG. 11B, the rivet 890 comprises a wing 896 that extends over the second sacrificial layer 850 and extends beyond the sidewall spacer 844 and the corner of the movable conductor 840. In embodiments such as interferometric modulators, the wing 896 overlaps about 1 µm to about 2 µm of the moveable reflective layer.

In step 960, the first and second sacrificial layers 830 and 850 are substantially completely removed and/or etched away to form the cavity 887. Those skilled in the art will understand that the particular etching conditions depend on the identity of the second sacrificial material. In some embodiments, the second sacrificial material is selectively removed relative to other structures in the device. In some embodiments, the second sacrificial material is removed by ashing, for example, where the second sacrificial material is a resist, a photoresist, or a planarization material. In other embodiments, the second sacrificial material is etched away by another method known in the art, for example, by reactive ion etching and/or using a gas phase etchant (e.g., $XeF_2$). In some embodiments, the first sacrificial material is removed in the same step. In other embodiments, the first sacrificial material is removed in a different step.

In some embodiments, the sidewall spacer 844 is removed and/or etched away along with the second sacrificial layer 850 and/or the first sacrificial layer 830. Those skilled in the art will understand that the particular etching conditions depend on the identity of the spacer material. The structure resulting from removing both the first and the second sacrificial materials and the spacer material is illustrated in FIG. 11C in the relaxed condition. By removing the spacer material, the clearance, in the relaxed condition, is increased between the sidewall of the movable conductor 840 and the lower corner 889 under the step 878 of the deformable layer 870 in the illustrated embodiment. The underside transition of the step 878 of the deformable layer 870 is determined by the contour of the removed spacer 844. The increased clearance depends, at least in part, on the width of the spacer 844. In the illustrated embodiment, the width of the spacer, and the increased clearance, can be in the range of about 0.1 µm to 0.4 µm. In an interferometric modulator in the relaxed condition, the distance 883 between the top of movable reflective layer and the bottom of the ceiling of the cavity 887 (as determined by the deformable layer 870) can be in the range of about 0.2 µm to about 0.4 µm. This distance range would typically also apply to the horizontal clearance between the sidewall of the movable reflective layer and the lower corner 889 of the transition step 878 of the underside of the ceiling of the cavity 887 without the spacer. However, the horizontal clearance distance 885 obtained with a removable sidewall spacer increases by about 0.1 µm to about 0.4 µm for a total of about 0.3 µm to about 0.8 µm, which corresponds to a percentage increase of about 25% to about 200%. The increased clearance can improve the performance and reliability of the interferometric modulator. Preferably the horizontal clearance 885 is greater than 25%, more preferably greater than 50% and is typically 50 to 200% greater than the vertical distance 883, in the relaxed condition. The clearances discussed above and illustrated in FIG. 11C are pre-release clearances prior to removal of the sacrificial layer(s) and/or spacer. Preferably the post-release clearances are the same or similar, however small changes in cavity shape and clearances can result upon removal of the sacrificial layers and/or spacer.

It should be noted that various steps of the process 900 can be omitted and/or rearranged, depending on the embodiment.

The embodiments discussed above in reference to FIGS. 8, 10 and 11 all illustrated formation of the sidewall spacer next to a movable conductor (or mirror), where the sidewall of the movable conductor comprised a uniform 90° flat profile. This flat profile was used only as an example of one type of profile where the formation of the sidewall spacer can improve characteristics of the MEMS device. The improved characteristics include improved clearance between the movable conductor and the support structures and/or the deformable layer, as well as improved deposition of layers over the movable conductor and sidewall spacer. However, the sidewall spacer can offer even greater relative improvements for more severe sidewall profiles. More severe profiles include those with various reentrant profiles, which are defined as those including an inward slope of the sidewall. Reentrant profiles present a problem for deposition of the material of the deformable layer as discussed above. Metal layers, of which the deformable layer may comprise, may suffer from excessive stresses during formation when applied over sharp steps such as may develop during a wet etch. In addition to being adversely affected by sharp steps, metal layers may have problems in filing in reentrant regions that may also form during patterning of lower layers.

Figure 12A:
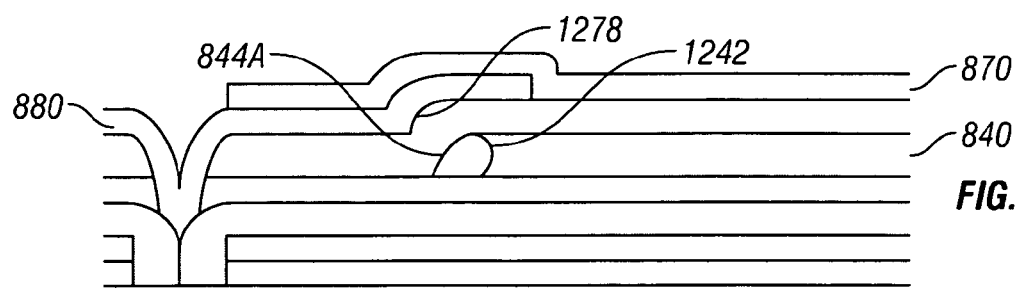
FIGS. 12A through 12C illustrate reentrant profiles that may be filled with a sidewall spacer using the process of FIG. 9.
Figure 12B:
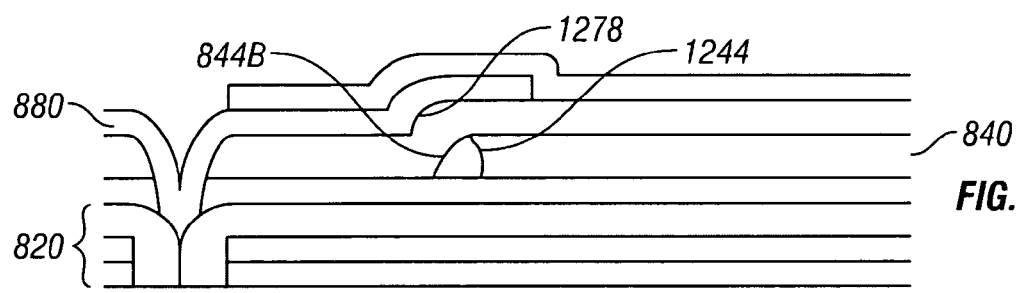
Figure 12C:
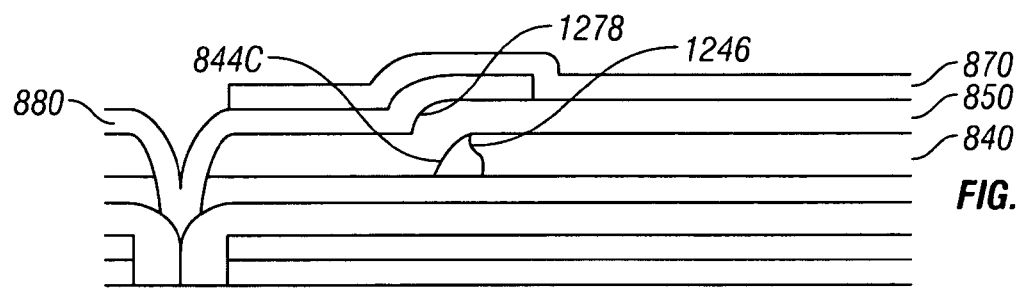

FIGS. 12A through 12C illustrate possible reentrant profiles in MEMS devices that may be filled with a sidewall spacer using the process 900 of FIG. 9. The devices shown comprise different reentrant profiles 1242, 1244 and 1246 in the sidewalls of the movable conductor 840. The reentrant profiles 1242 through 1246 are illustrated with sidewall spacers 844A, 844B and 844C, where the sidewall spacers 844A, 844B and 844C, substantially fill in the reentrant profiles 1242 through 1246.

The reentrant profiles depict types of undercutting that is typical of a wet etch process. Reentrant profile 1242, shown in FIG. 12A comprises a rather sharp upper corner and a deep reentrant region that slopes outward at the bottom. Reentrant profile 1244, shown in FIG. 12B, comprises a more curved upper corner and a reentrant region less deep than the reentrant profile 1242. Reentrant profile 1246, shown in FIG. 12C, comprises large curved upper corner that juts out at first and then slopes inward at the lower corner. All the reentrant profiles 1242, 1244 and 1246 could potentially be problematic when forming a metal layer over the reentrant region. Metal layers, of which the deformable layer may comprise, may suffer from excessive stresses during formation when applied over the upper corners. Deposited metal layers may also have problems filling in the reentrant regions 1242, 1244 and 1246. However, by forming the spacers 844A, 844B and 844C as discussed above in reference to the process 900 in FIG. 9, the reentrant profiles 1242, 1244 and 1246 can be substantially filled in and a smooth convex up contour may result. When the second sacrificial layer 850, and subsequent upper layers (e.g., posts 880, deformable layer 870, and/or rivets 890) are formed over the spacer, they will also comprise smooth contours substantially like the spacers. Without spacers formed in reentrant regions, overlying layers (e.g., sacrificial layers, oxide layers, etc.) will tend to replicate the reentrant profiles.

If the spacers 844A, 844B and 844C are removed in a release etch, the movable conductor will have the inward reentrant regions 1242, 1244 and 1246, but the upper layers (e.g., posts 880, deformable layer 870, and/or rivets 890) will comprise upwardly convex surfaces (such as the surfaces 1278 shown in FIGS. 12A, 12B and 12C) proximal to the inward reentrant region.

The MEMS devices shown in FIG. 12 all have a configuration similar to FIG. 10, where a post structure 880 underlies a deformable layer 870. However, other embodiments such as the integrated post/deformable layer configuration of FIG. 8 and the overlying rivet configuration of FIG. 11 could also be used with movable conductors with sidewalls having the reentrant profiles shown, with similar contours resulting in the upper layers formed over the spacers 844A to 844C.

In addition to reentrant profiles, other sidewall profiles can also be improved in relation to improved coverage and/or clearances of overlying layers by use of the sidewall spacer. The vertical sidewalls of the movable conductor 840 in FIGS. 10 and 11 may be preferable in some embodiments of MEMS devices (e.g., optical MEMS). Preferably, the vertical edge has a downward edge angle of about 90 degrees as measured from the horizontal (parallel to the substrate). However a slight outward slope or tapered sidewall or slightly inwardly sloped or reentrant may also be used. In these embodiments, sidewalls of the movable conductor 840 preferably have downward edge angles in a range from about 85 degrees (slightly tapered) to about 95 degrees (slightly reentrant). In this range, the sidewall spacers smooth the contours of the sharp steps of the near vertical edges. Layers overlying the spacers and the movable conductor 840 will have a more continuous coverage than if the spacer was not used. Clearances may also be improved by removal of the spacer (e.g., with one or more sacrificial layers).

As discussed above, tapered openings can be formed having smooth, less sharp edges by employing etching techniques known to those of skill in the art (e.g., special lithography and expensive dry etch techniques). Overlying layers may be deposited over these types of tapered openings in a smooth and continuous fashion and thus negate the need for this feature of the sidewall spacer. However, the use of a sidewall spacer formed adjacent to a tapered sidewall can still improve the horizontal clearances between overlying layers and the tapered sidewall when the sidewall spacer is removed (e.g., by etching).

An embodiment of an interferometric modulator includes means for transmitting light, means for reflecting light, means for movably supporting the reflecting means and for providing a restoring force in response to a movement of the reflecting means towards or away from the transmitting means, a cavity defined by the reflecting means and the supporting means, wherein the reflecting means is disposed within the cavity, and means for horizontally spacing an edge of the supporting means more than a vertical distance between an upper surface of the reflecting means and a lower surface of the supporting means. With reference to FIG. 10, aspects of this embodiment include where the spacing means is a gap created by a removed sacrificial sidewall spacer, such as the sidewall spacer 844, on edges of the reflecting means, where the spacing means is a sidewall spacer on the edges of the reflecting means such as the sidewall spacer 844, where the transmitting means is an optical stack such as the optical stack 820, where the reflecting means is a movable mirror such as the movable mirror 840, and where the supporting means is a deformable layer such as the deformable layer 870.

While the above detailed description has shown, described, and pointed out novel features of the invention as applied to various embodiments, it will be understood that various omissions, substitutions, and changes in the form and details of the device or process illustrated may be made by those skilled in the art without departing from the spirit of the invention. As will be recognized, the present invention may be embodied within a form that does not provide all of the features and benefits set forth herein, as some features may be used or practiced separately from others.

I claim:

1. An interferometric modulator, comprising:
   a substrate;
   an optical stack over the substrate;
   a deformable layer;
   a plurality of support structures arranged over the substrate and configured to support the deformable layer;
   a cavity defined by the optical stack, the support structures, and the deformable layer; and
   a movable mirror disposed within the cavity, wherein the movable mirror is secured to the deformable layer, wherein a cavity ceiling spaced above an edge of the mirror comprises a step transitioning toward the substrate and defining a lower corner at the bottom of the step;
   wherein a distance from a sidewall of the movable mirror to the lower corner of the ceiling step is more than 25 percent greater than a distance from an upper surface of the movable mirror to the cavity ceiling above the edge of the mirror when the interferometric modulator is in a relaxed condition.

2. The interferometric modulator of claim 1, wherein the sidewall of the movable mirror comprises a downward edge angle in a range from about 85 degrees to about 95 degrees.

3. The interferometric modulator device of claim 1, wherein the plurality of support structures and the deformable layer are formed from the same material.

4. The interferometric modulator device of claim 1, wherein the plurality of support structures comprise posts supporting the deformable layer on a lower surface of the deformable layer facing the substrate.

5. The interferometric modulator device of claim 1, wherein the plurality of support structures comprise rivets overlying the deformable layer in depressions defined by the deformable layer.

6. The interferometric modulator device of claim 1, wherein the movable conductor comprises aluminum.

7. The interferometric modulator device of claim 1, further comprising a sidewall spacer attached to the sidewall of the movable mirror, wherein the sidewall spacer comprises a substantially convex top surface away from the substrate.

8. The interferometric modulator device of claim 7, wherein the deformable layer conforms to the upwardly convex surface of the sidewall spacer.

9. The interferometric modulator device of claim 1, wherein the distance from the sidewall of the movable mirror to the lower corner of the ceiling step is about 50 percent to about 200 percent greater than the distance from the upper surface of the movable mirror to the cavity ceiling above the edge of the mirror when the interferometric modulator is in the relaxed condition.

10. The interferometric modulator device of claim 1, wherein the distance from the sidewall of the movable mirror to the lower corner of the ceiling step is about 0.3 μm to about 0.8 μm.

11. An array of interferometric modulators, comprising the interferometric modulator of claim 1.

12. A display device comprising:
   an array of interferometric modulators as claimed in claim 11,
   a processor that is configured to communicate with the array, the processor being configured to process image data; and
   a memory device that is configured to communicate with the processor.

13. The display device of claim 12, further comprising a driver circuit configured to send at least one signal to the array.

14. The apparatus as recited in claim 13, further comprising a controller configured to send at least a portion of the image data to the driver circuit.

15. The apparatus as recited in claim 12, further comprising an image source module configured to send the image data to the processor.

16. The apparatus as recited in claim 15, wherein the image source module comprises at least one of a receiver, transceiver, and transmitter.

17. The apparatus as recited in claim 12, further comprising an input device configured to receive input data and to communicate the input data to the processor.

18. A microelectromechanical systems (MEMS) device, comprising:
   a substrate;
   a deformable layer;

a plurality of support structures arranged over the substrate and configured to support the deformable layer;

a cavity defined by the substrate, the support structures, and the deformable layer; and a movable conductor disposed within the cavity, wherein the movable conductor is secured to the deformable layer, and wherein the movable conductor comprises a side wall with an inward reentrant region;

wherein the deformable layer comprises an upwardly convex surface proximal to the inward reentrant region of the sidewall of the movable conductor.

19. The MEMS device of claim 18, wherein the plurality of support structures and the deformable layer are formed from the same material.

20. The MEMS device of claim 18, wherein the movable conductor comprises aluminum.

21. The MEMS device of claim 18, further comprising a sidewall spacer attached to the sidewall of the movable conductor, wherein the sidewall spacer comprises a substantially convex top surface away from the substrate.

22. The MEMS device of claim 21, wherein the upwardly convex surface of the deformable layer is of substantially the same shape as the convex top surface of the sidewall spacer.

23. An interferometric modulator, comprising the MEMS device of claim 18.

24. The interferometric modulator of claim 23, wherein a cavity ceiling spaced above an edge of the movable conductor comprises a step transitioning toward the substrate and defining a lower corner at the bottom of the step, and wherein a distance from the sidewall of the movable conductor to the lower corner of the ceiling step is about 50% to about 200% greater than a distance from an upper surface of the movable conductor to the cavity ceiling above the edge of the conductor when the interferometric modulator is in a relaxed condition.

25. The interferometric modulator of claim 23, wherein a cavity ceiling spaced above an edge of the movable conductor comprises a step transitioning toward the substrate and defining a lower corner at the bottom of the step, and wherein a distance from the sidewall of the movable conductor to the lower corner of the ceiling step is about 0.3 μm to about 0.8 μm.

26. An interferometric modulator comprising:

means for transmitting light;

means for reflecting light;

means for movably supporting the reflecting means and for providing a restoring force in response to a movement of the reflecting means towards or away from the transmitting means;

a cavity defined by the reflecting means and the supporting means, wherein the reflecting means is disposed within the cavity; and means for horizontally spacing an edge of the reflecting means from the supporting means more than a vertical distance between an upper surface of the reflecting means and a lower surface of the supporting means.

27. The interferometric modulator of claim 26, wherein the spacing means comprises a gap created by a removed sacrificial sidewall spacer on edges of the reflecting means.

28. The interferometric modulator of claim 26, wherein the spacing means comprises a sidewall spacer on edges of the reflecting means.

29. The interferometric modulator of claim 26, wherein the transmitting means comprises an optical stack.

30. The interferometric modulator of claim 26, wherein the reflecting means comprises a movable mirror.

31. The interferometric modulator of claim 26, wherein the supporting means comprises a deformable layer.

* * * * *

UNITED STATES PATENT AND TRADEMARK OFFICE
CERTIFICATE OF CORRECTION

PATENT NO.        : 7,545,552 B2                                            Page 1 of 1
APPLICATION NO.   : 11/583575
DATED             : June 9, 2009
INVENTOR(S)       : Gregory David U'Ren It is certified that error appears in the above-identified patent and that said Letters Patent is hereby corrected as shown below:

At column 1, line 16, please change "and or" and insert therefore, --and/or--.

At column 8, lines 45-59, after "drive 22.", please delete "The drive controller............array driver 22."

At column 13, line 5, please change "840-" and insert therefore, --840'--.

At column 20, line 4, please change "filing" and insert therefore, --filling--.

At column 22, lines 41-42, in Claim 12, please change "claim 11," and insert therefore, --claim 11;--.

Signed and Sealed this

Fifth Day of January, 2010

David J. Kappos
*Director of the United States Patent and Trademark Office*